United States Patent
Liu et al.

(10) Patent No.: US 6,890,655 B2
(45) Date of Patent: May 10, 2005

(54) DIAMOND COATED CUTTING TOOL AND METHOD FOR MAKING THE SAME

(75) Inventors: Yixiong Liu, Greensburg, PA (US); Joseph M. Tauber, Harrison City, PA (US); Charles Erik Bauer, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 0 days.

(21) Appl. No.: 10/635,832

(22) Filed: Aug. 6, 2003

(65) Prior Publication Data

US 2004/0028892 A1 Feb. 12, 2004

Related U.S. Application Data

(62) Division of application No. 09/946,545, filed on Sep. 5, 2001, now Pat. No. 6,660,329.

(51) Int. Cl.[7] .............................................. B32B 9/00
(52) U.S. Cl. ........................... 428/408; 51/307; 51/309; 428/325; 428/472; 428/697; 428/698; 428/699
(58) Field of Search .................. 51/307, 309; 428/408, 428/216, 325, 472, 698, 699, 697

(56) References Cited

U.S. PATENT DOCUMENTS

| | | | |
|---|---|---|---|
| 4,348,263 A | 9/1982 | Draper et al. | 204/29 |
| 4,414,244 A | 11/1983 | Timberlake et al. | 427/105 |
| 4,507,184 A | 3/1985 | Murata et al. | 204/129.35 |
| 4,851,254 A | 7/1989 | Yamamoto et al. | 427/37 |
| 4,915,977 A | 4/1990 | Okamoto et al. | 427/37 |
| 4,938,940 A | 7/1990 | Hirose et al. | 423/446 |
| 5,068,148 A | 11/1991 | Nakahara et al. | 428/335 |
| 5,094,878 A | 3/1992 | Yamamoto et al. | 427/37 |
| 5,164,051 A | 11/1992 | Komaki et al. | 204/129.43 |
| 5,176,803 A | 1/1993 | Barbuto et al. | 204/129.1 |
| 5,268,045 A | 12/1993 | Clare et al. | 148/518 |
| 5,304,461 A | 4/1994 | Inoue et al. | 430/323 |
| 5,380,408 A | 1/1995 | Svensson et al. | 204/129.1 |
| 5,474,021 A | 12/1995 | Tsuno et al. | 117/97 |
| 5,585,176 A | 12/1996 | Grab et al. | 428/336 |
| 5,648,119 A | 7/1997 | Grab et al. | 427/249 |
| 5,650,059 A | 7/1997 | Shumaker et al. | 205/640 |
| 5,701,578 A | 12/1997 | Liu et al. | 428/565 |
| 5,709,907 A | 1/1998 | Battaglia et al. | 427/126.1 |
| 5,716,170 A | 2/1998 | Kammermeier et al. | 408/145 |

(Continued)

FOREIGN PATENT DOCUMENTS

| | | |
|---|---|---|
| JP | 6086096 | 5/1985 |
| JP | 6152363 | 3/1986 |
| JP | 6267174 | 3/1987 |
| JP | 63199870 | 8/1988 |
| JP | 1119671 | 5/1989 |
| JP | 1201475 | 8/1989 |
| JP | 2217398 | 8/1990 |
| JP | 2000 326105 | 11/2000 |
| WO | 9104353 | 4/1991 |

OTHER PUBLICATIONS

Roebuck et al. "Measurement of WC Grainsize Distribution" NLP Report CMMT "A"141 1999.
Complete English translation of JP 2000–326105 (11 pages).
European Search Report (Mar. 1, 2004) in European Patent Application 0 2019797.6–2119.
English Abstract of Japanese Patent Pub. No. 2000 326105.

Primary Examiner—Archene Turner
(74) Attorney, Agent, or Firm—John J. Prizzi

(57) ABSTRACT

A diamond coated cutting tool that has a treated substrate and a diamond coating thereon. In the process of making the substrate, the sintered substrate is re-sintered to form a re-sintered substrate and the re-sintered substrate is chemically treated to remove cobalt on the surface of the re-sintered substrate as to form a treated substrate.

23 Claims, 35 Drawing Sheets

U.S. PATENT DOCUMENTS

| | | |
|---|---|---|
| 5,759,623 A | 6/1998 | De Mello Borges et al. .......... 427/249 |
| 5,776,246 A | 7/1998 | Tanabe et al. ............. 117/89 |
| 5,858,539 A | 1/1999 | Reineck et al. ........... 428/408 |
| 5,891,522 A * | 4/1999 | Olson ...................... 427/577 |
| 5,952,102 A | 9/1999 | Cutler et al. ............. 428/408 |
| 5,961,718 A | 10/1999 | Chen et al. ............... 117/94 |
| 5,962,071 A | 10/1999 | Reineck et al. ........... 427/249 |
| 5,976,707 A | 11/1999 | Grab et al. .............. 428/547 |
| 6,022,175 A | 2/2000 | Heinrich et al. .......... 407/119 |
| 6,027,808 A | 2/2000 | Aoki et al. .............. 428/408 |
| 6,051,063 A | 4/2000 | Tanabe et al. ............ 117/89 |
| 6,063,149 A | 5/2000 | Zimmer et al. ........... 51/295 |
| 6,110,240 A | 8/2000 | Saguchi et al. ........... 51/307 |
| 6,152,660 A | 11/2000 | Papajewski et al. ....... 408/144 |
| 6,267,867 B1 * | 7/2001 | Olson ...................... 205/660 |
| 6,287,682 B1 | 9/2001 | Grab et al. |
| 6,638,474 B2 * | 10/2003 | Liu et al. ................. 419/14 |

\* cited by examiner

DIAMOND COATED CUTTING TOOL AND METHOD FOR MAKING THE SAME

This application is a Divisional of prior application Ser. No. 09/946,545, filed Sep. 5, 2001 now U.S. Pat. No. 6,660,329.

FIELD OF THE INVENTION

The invention pertains to a coated cutting tool and a method for making the same. More particularly, the invention pertains to a diamond coated cutting tool that has a cemented (cobalt) tungsten carbide substrate and a method for making the same.

BACKGROUND OF THE INVENTION

Diamond coated cutting tools demonstrate excellent metalcutting properties in certain circumstances. Typically, diamond coated cutting tools comprise a substrate of cemented (cobalt) tungsten carbide that has a diamond coating on the surface thereof. It has always been, and still remains, a goal to improve the adhesion of the diamond coating to the substrate.

U.S. Pat. No. 5,585,176 to Grab et al. and U.S. Pat. No. 5,648,119 to Grab et al. each shows a diamond coated cutting tool. In the process to make the substrate for the cutting tool of the '176 Patent and the '119 Patent, there is a sintering step (or re-sintering step) that is supposed to cause grain growth and cobalt (i.e., binder) depletion at the surface of the substrate. Larger grains at the surface, as well as the depletion of cobalt binder at the surface, generally improve the adhesion of the diamond coating to the substrate.

While the process of the '176 Patent and the '119 Patent produce diamond coated cutting tools with acceptable adhesion properties, the re-sintering process is sensitive to the level of carbon in the cobalt binder of the substrate prior to re-sintering. The magnetic saturation value is a measure of the carbon content in the cobalt binder. Magnetic saturation is generally reported in either microtesla cubic meter per kilogram cobalt ($\mu$T-m$^3$/kg) or gauss cubic centimeter per gram cobalt (gauss-cm$^3$/gm). When the magnetic saturation is too low the cobalt binder is not sufficiently mobile (or fluid), and as a result, the cobalt does not evaporate from the surface of the substrate during re-sintering. When the magnetic saturation is too high, a cobalt binder-carbon cap forms on the surface of the substrate during re-sintering that effectively halts the continued evaporation of the cobalt binder.

Heretofore, in the production of commercial quantities of the re-sintered cutting tool substrates the magnetic saturation value of the sintered substrates, i.e., the substrate prior to re-sintering, must fall within a narrow range. Practically speaking, such a narrow range for the magnetic saturation value is difficult to accurately measure. This difficulty in measuring may result in not all of the sintered substrates falling within the prescribed range of the magnetic saturation value which may, in turn, result in re-sintered substrates that have certain drawbacks as described above if the magnetic saturation value is either too high or too low. Iron contamination can also affect the magnetic saturation value by causing it to be over reported. This may also result in the re-sintering of sintered substrates that do not have a magnetic saturation value within the prescribed range.

These drawbacks associated with the difficulty in accurately measuring the magnetic saturation value make it highly desirable to provide a process for making a diamond coated cutting tool that does not exhibit this sensitivity to the carbon content in the cobalt binder of the sintered substrate, and hence, accommodates a sintered substrate with a broader range of magnetic saturation values. In other words, it would be highly desirable to provide a process for making a resultant cutting tool substrate (and provide the resultant substrate itself) that is suitable for diamond coating and that accommodates a broader range of acceptable magnetic saturation values of the sintered substrate so as to have a broadened so-called "carbon window" as compared to earlier processes.

Heretofore, in the production of diamond coated cutting tools that use a re-sintered cutting tool substrate, the grain size of the tungsten carbide in the sintered substrate has been fine. As a result of using the fine-grained sintered substrate the extent of re-sintering has had to be relatively long to achieve tungsten carbide grains with a sufficiently larger grain size in the re-sintered substrate. It would be highly desirable to provide a diamond coated cutting tool that comprises a diamond-coated re-sintered substrate wherein the substrate does not require as long a re-sintering time to produce a re-sintered substrate that has tungsten carbide that is of a sufficiently large grain size.

SUMMARY OF THE INVENTION

In one form thereof, the invention is a process for making a diamond coated cutting tool. The process comprising the following steps: providing a sintered substrate, the sintered substrate comprising tungsten carbide and cobalt, the sintered substrate having an average tungsten carbide grain size of between about 3 micrometers and about 20 micrometers; re-sintering the sintered substrate to produce a re-sintered substrate, the re-sintered substrate having a surface; the re-sintered substrate having a surface region beginning at and extending inwardly from the surface, the re-sintered substrate having a bulk region inwardly of the surface region, and the surface region of the re-sintered substrate having an average tungsten carbide grain size of between about 12 micrometers and about 60 micrometers, the bulk region of the re-sintered substrate having an average tungsten carbide grain size of between about 3 micrometers and about 20 micrometers, and wherein the average tungsten carbide grain size in the surface region is greater than the average tungsten carbide grain size in the bulk region; subjecting the re-sintered substrate to a chemical treatment for the removal of cobalt at the surface of the re-sintered substrate to produce a treated substrate, and wherein the treated substrate has a surface with a cobalt peak/tungsten peak ratio of less than 0.2 and there being an absence of continuous porosity below the surface of the treated substrate; and adherently depositing a diamond coating to at least a portion of the surface of the treated substrate.

In another form thereof, the invention is a diamond coated cutting tool produced by a process comprising the steps of: providing a sintered substrate, the sintered substrate comprising tungsten carbide and cobalt, the sintered substrate having an average tungsten carbide grain size of between about 3 micrometers and about 20 micrometers; re-sintering the sintered substrate to produce a re-sintered substrate, the re-sintered substrate having a surface; the re-sintered substrate having a surface region beginning at and extending inwardly from the surface, the re-sintered substrate having a bulk region inwardly of the surface region, and the surface region of the re-sintered substrate having an average tungsten carbide grain size of between about 12 micrometers and about 60 micrometers, the bulk region of the re-sintered substrate having an average tungsten carbide grain size of between about 3 micrometers and about 20 micrometers; subjecting the re-sintered substrate to a chemical treatment for the removal of cobalt at the surface of the re-sintered substrate to produce a treated substrate, and wherein the treated substrate has a surface with a cobalt peak/tungsten peak ratio of less than 0.2 and there being an absence of continuous porosity below the surface of the treated substrate, and wherein the average tungsten carbide grain size in the surface region is greater than the average tungsten carbide grain size in the bulk region; and adherently depositing a diamond coating to at least a portion of the surface of the treated substrate.

In still another form thereof, the invention is a diamond coated cutting tool comprising a re-sintered substrate. The re-sintered substrate has a composition comprising between about 2 weight percent to about 12 weight percent cobalt, and tungsten and carbon wherein most of the tungsten and carbon is in the form of tungsten carbide. The re-sintered substrate has a surface, and the surface is subjected to a chemical treatment. The re-sintered substrate has a surface region extending inwardly from the surface and a bulk region being inwardly of the surface region. The surface region has an average tungsten carbide grain size of between about 12 micrometers and about 60 micrometers. The bulk region has an average tungsten carbide grain size of between about 3 micrometers about 20 micrometers. The average tungsten carbide grain size in the surface region is greater than the average tungsten carbide grain size in the bulk region. A diamond coating is on the surface of the re-sintered substrate.

BRIEF DESCRIPTION OF THE DRAWINGS

The following is a brief description of the drawings that form a part of this patent application.

DETAILED DESCRIPTION

Figure 1:
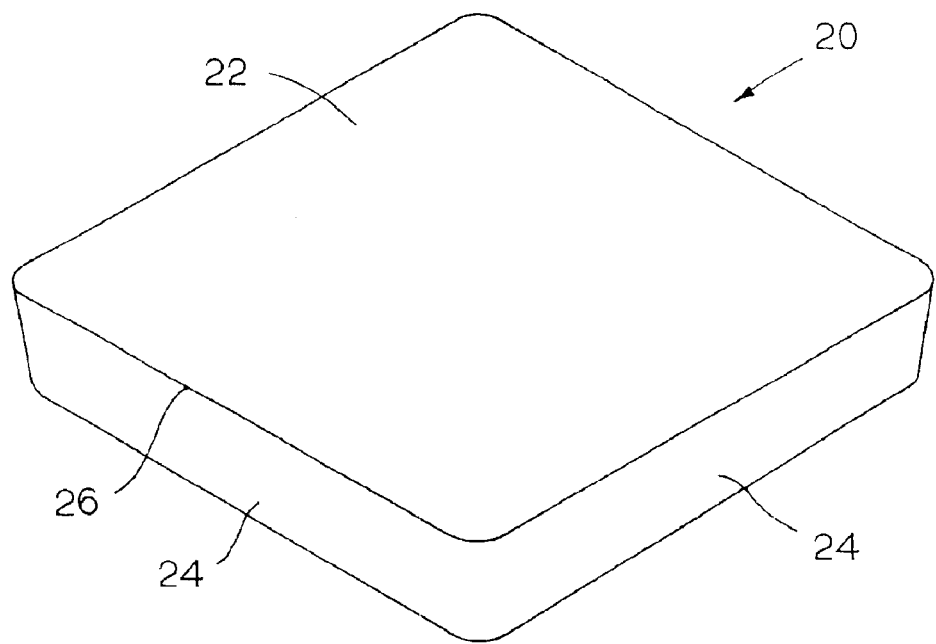
FIG. 1 is an isometric view of a specific embodiment of a cutting tool.
Figure 2:
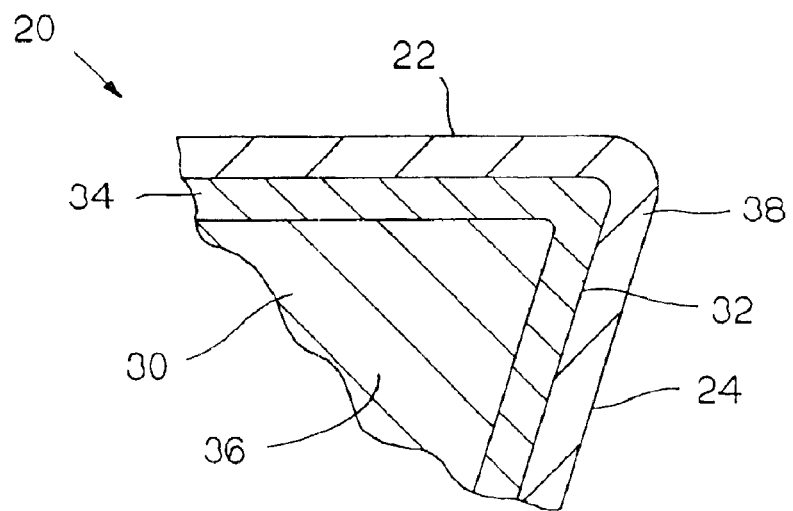
FIG. 2 is schematic cross-sectional view of a cutting edge of the cutting tool of FIG. 1 showing the treated substrate and the diamond coating on the substrate.

Referring to the drawings, FIG. 1 illustrates a specific embodiment of a cutting tool generally designated as 20. Cutting tool 20 has a top rake surface 22 and flank surfaces 24. The top rake surface 22 intersects with the flank surfaces 24 so as to form cutting edges 26 at the intersections. As shown in FIG. 2, cutting tool 20 comprises a treated substrate 30 that has a diamond coating 38 thereon.

The treated substrate 30 has a surface 32. The treated substrate 30 has a surface region 34 that begins at (or near) and extends inwardly from the surface 32. The treated substrate 30 further has a bulk region 36 inwardly of the surface region 34. As will be discussed hereinafter, the grain size of the tungsten carbide grains in the surface region 34 is different from the grain size of the tungsten carbide grains in the bulk region 36.

As will be discussed hereinafter, the diamond coating is applied to the treated substrate. FIG. 2 shows that the diamond coating has been applied to the rake surface and the flank surface(s) of the substrate. However, it should be appreciated that there are instances in which the coating may only be applied to a selected one or a portion of the surfaces.

As will become apparent from the discussion hereinafter, the treated substrate is the resultant article from a re-sintering of a sintered substrate to form a re-sintered substrate. The re-sintered substrate is chemically treated (and then optionally subjected to a treatment (called seeding or scratching) of diamond particles suspended in a solvent and agitated ultrasonically) to form the treated substrate.

In regard to the composition of the sintered substrate, it is preferred that the sintered substrate 30 is a cemented (cobalt) tungsten carbide material that does not have any (or at most has minimal) other carbide-forming elements (e.g., tantalum, titanium, niobium, vanadium, zirconium, hafnium, and chromium) therein. More specifically, it is preferable if the total of the titanium, niobium and zirconium is less than 0.2 weight percent. It is even more preferable if the total of these elements is less than 0.1 weight percent. It is the most preferable if the total of these elements is less than 0.01 weight percent.

For the sintered substrate, it is preferable if the following levels of the following elements are present: less than 0.4 weight percent tantalum, less than 0.2 weight percent hafnium, less than 0.1 weight percent chromium, and less than 0.1 weight percent vanadium. It is most preferable if the contents of tantalum, hafnium, chromium, and vanadium is about zero weight percent.

For the sintered substrate, it is preferred if less than 0.2 weight percent iron is present and less than 0.2 weight percent nickel is present. It is most preferable if there is an absence of iron and nickel from the treated substrate.

The sintered substrate has a preferred composition of between about 2 weight percent and 12 weight percent cobalt with the balance being tungsten and carbon wherein most of the tungsten and carbon is in the form of tungsten carbide. A more preferred composition for the treated substrate is between about 5.2 weight percent and about 6.5 weight percent cobalt with the balance being tungsten and carbon wherein most of the tungsten and carbon is in the form of tungsten carbide. A still more preferred composition for the treated substrate is between about 5.7 weight percent and about 6.2 weight percent cobalt with the balance being tungsten and carbon wherein most of the tungsten and carbon is in the form of tungsten carbide.

The preferred bulk average grain size of the tungsten carbide in the sintered substrate is between about 3 micrometers and about 20 micrometers as measured according to the technique set forth in Roebuck, B., "Measurement of WC Grain Size", NPL Report CMMT (A)141 page 2 (January 1999). A more preferred average bulk grain size of the tungsten carbide is between 7 micrometers and 13 micrometers. To determine the grain size, the substrate was cut, mounted, polished and etched according to ASTM Procedure D657. Then the grain size was measured according to the technique in the Roebuck et al. article.

For the sintered substrate, one preferred range of the magnetic saturation value is between about 17.3 and about 19.8 microtesla cubic meter per kilogram cobalt. Another preferred range of the magnetic saturation value of the sintered substrate is between about 17.8 and about 18.8 microtesla cubic meter per kilogram cobalt.

Still referring to the composition of the sintered substrate, it is preferred if there is enough free tungsten in the binder to permit grains of tungsten carbide to grow as the cobalt is evaporated during the re-sintering process, and yet, avoid the formation of eta phase.

Referring to the microstructure of the treated substrate 30, it is preferable that the treated substrate 30 has a surface region 34 that extends inwardly from the surface 32 of the treated substrate 30. It is typical that the surface region 34 extends inwardly from the surface 32 a distance of between about 10 micrometers and about 60 micrometers. Oftentimes the depth of the surface region 34 is equal to the average grain size of one tungsten carbide grain. The preferred tungsten carbide grain size in the surface region of the treated substrate is between 10 micrometers and 60 micrometers as measured according to the Roebuck et al. technique described above.

Inwardly of the surface region 34 is a bulk region 36 of the treated substrate. The preferred average grain size of the tungsten carbide in the bulk region of the treated substrate is between 3 micrometers and 15 micrometers as measured according to the Roebuck et al. technique described hereinabove. More preferably, the average grain size of the tungsten carbide in the bulk region of the treated substrate is between about 8 micrometers and about 13 micrometers according to the Roebuck et al. technique described hereinabove.

Referring to the porosity rating of the treated substrate, it is preferred of there is no C-type porosity in either the surface region of the treated substrate or the bulk region of the treated substrate. An acceptable porosity rating according to ASTM Designation B276–91 (Reapproved 1996) is A02+B00+C00 for the surface region, and A02+B00+C00 for the bulk region of the treated substrate. Preferably, there is no eta phase any where in the treated substrate.

Referring to the surface roughness, $R_a$, of rake surface of the treated substrate, it is preferable that the surface roughness, $R_a$, be greater than about 25 microinches and more preferably be greater than about 35 microinches.

It is preferable that the surface of the treated substrate (i.e., after subjection to the electropolish quick dip step) exhibits as little as possible residual surface cobalt thereon. The ratio (Co/W) of the cobalt peak height (Co-K-alpha) to the tungsten peak height (W-L-alpha) is one way to determine the amount of the residual surface cobalt. For the treated substrate, it has typically been found that it is preferable if the portion at the edge of the rake surface adjacent to the nose has a Co/W peak ratio of less than or equal to 0.4, and the center of the rake surface preferably has a Co/W peak ratio of less than or equal to 0.2. Even more preferably, the Co/W peak ratio at either the edge of the rake surface adjacent to the nose or at the center of the rake surface is less than 0.1.

Referring to the diamond coating, preferably, the average adhesion strength of the diamond coating to the surface of the treated substrate is at least 60 kilograms (kg). More preferably, the adhesion strength is at least 80 kg, and most preferably the adhesion strength is at least 100 kg. The test to determine the adhesion strength is a Rockwell A indentation test.

As measured on the rake surface near the cutting edge, the diamond coating on the rake surface of a cutting tool preferably has an average thickness of between about 5 micrometers to about 100 micrometers, and more preferably the average thickness is between about 22 micrometers to about 100 micrometers. For cutting tools that are to be used in continuous and interrupted turning of aluminum alloys (e.g., A380 and A390), a preferred average thickness of the diamond coating is between about 22 micrometers and about 50 micrometers, and a more preferred range for the average thickness of the diamond coating is between about 35 micrometers and about 50 micrometers.

As one preferred option, the diamond coating applied to the rake surface is left in its as deposited condition so as to have a surface roughness, $R_a$, of greater than about 25 microinches while the diamond coating on the flank surface (s) is made smoother by polishing or the like. In this option, it thus can be seen that the surface of the rake surface has a greater surface roughness, $R_a$, than the surface roughness, $R_a$, of the flank surface(s).

Generally speaking, the process to produce the diamond coated cutting tool comprises blending the components of the starting powder to form a powder blend. In this case, the typical starting powders comprise cobalt powder, tungsten carbide powder and carbon powder to the extent needed to adjust the carbon level in the composition. The powder blend generally includes a fugitive binder and lubricant materials.

After completion of the blending step, the powder blend is then pressed into a green compact. The green compact is in the general shape of a cutting tool.

The green compact is then sintered until it reaches full density so as to form a sintered substrate. Typically, the sintering takes place at a sintering temperature that ranges between about 2550 degrees Fahrenheit (about 1400 degrees Centigrade) and about 2910 degrees Fahrenheit (about 1600 degrees Centigrade) wherein the preferred sintering temperature equals about 2700 degrees Fahrenheit (about 1482 degrees Centigrade. The sintering time is sufficient to densify the compact. The atmosphere is vacuum or an inert atmosphere. The compact may be pressure sintered or HIPped (if necessary) to achieve the proper density.

Optionally, instead of the cutting tool being an as-molded tool, all or part of the sintered substrate may be ground to size. In this regard, only the top and bottom of the cutting tool may be ground or in some cases the entire cutting tool may be ground. A hone of about 0.0005 inches (0.013 millimeters [mm]) to about 0.0015 inches (0.038 mm) may also be applied to the sintered substrate after the grinding and before the re-sintering.

The sintered substrate (either in the as-molded condition or in an as-ground condition depending upon the specific application) is then subjected to a re-sintering so as to coarsen the grains of tungsten carbide at the surface of the substrate and also to remove cobalt from the surface of the sintered substrate. This re-sintering step is shown and described in U.S. Pat. No. 5,585,176 to Grab et al. and U.S. Pat. No. 5,648,119 to Grab et al., both of these patents are incorporated by reference herein. The resultant product of re-sintering the sintered substrate is a re-sintered substrate that has an acceptable surface roughness and a reduction in the amount of cobalt at the surface thereof.

The re-sintering step, which must occur at a temperature above the liquidus temperature of the binder, typically falls within the following parameters: a temperature of between about 2600 degrees Fahrenheit (about 1427 degrees Centigrade) and about 2900 degrees Fahrenheit (about 1593 degrees Centigrade), a duration that provides a minimum rake surface roughness such as, for example, 38 microinches, $R_a$, for some applications and wherein this duration is typically between about 3 hours and about 7 hours, and a pressure of between about 0.5 torr of nitrogen and about 3 torr of nitrogen. A preferred set of parameters for the re-sintering step is a re-sintering temperature of about 2800 degrees Fahrenheit (about 1538 degrees Centigrade) for a duration of either about 3 hours or about 4 hours and under a pressure of 1.5 torr nitrogen where the nitrogen gas is being flowed through the furnace.

The low level of grain growth inhibitors (e.g., vanadium, chromium, titanium, niobium and tantalum) in the sintered substrate helps reduce the amount of time necessary to achieve the desired minimum surface roughness such as, for example, 38 microinches, $R_a$, for some applications. In addition, the relatively large grain size of the tungsten carbide grains (e.g., up to 12 micrometers) in the sintered substrate helps reduce the amount of re-sintering needed to achieve the desired minimum surface roughness such as, for example 38 microinches, $R_a$, for some applications.

The re-sintered substrate is then subjected to a chemical treatment, e.g., an electropolish quick dip, so as to remove additional cobalt, as well as any carbon, iron and nickel, at the surface of the re-sintered substrate without undermining the tungsten carbide grains at the surface of the re-sintered substrate. The preferred solution in which the re-sintered substrate is dipped in a solution of sulfuric acid, phosphoric acid and water sold under the name Hydrite 4000 from Hydrite Chemical Company located at 300 North Packard Blvd., Brookfield, Wis. 53045. The Hydrite 4000 solution comprises about 47–49 weight percent sulfuric acid, about 47–49 weight percent phosphoric acid, and about 2–6 weight percent water.

The electric current levels are determined by the size of the re-sintered substrate. For cutting tools that are of a size less than or equal to ½ inch (1.27 centimeters) I.C. (inscribed circle) the current is 1 amp per cutting tool for a duration of 30 seconds. For cutting tools that are of a size greater than ½ inch (1.27 cm) I.C. (inscribed circle), the current is 1.5 amps per cutting tool for a duration of 30 seconds.

After completion of the electropolish quick dip, the substrate is washed and rinsed with water and sodium hydroxide after the dip and then dried wherein the resultant product is a treated substrate. Applicants contemplate that other chemical methods may be used to remove cobalt from the surface of the re-sintered substrate.

As an option, the treated substrate may next be subjected to an ultrasonic diamond seeding (or scratching) treatment. After completion of the ultrasonic seeding (or scratching) treatment, the substrate is still considered to be a treated substrate. Thus, one can appreciate that the treated substrate may or may not have been subjected to an ultrasonic diamond seed or scratch thereon.

The treated substrate is then coated with a layer of diamond via a vapor deposition technique (e.g., hot filament, DC plasma jet or microwave plasma). It is preferable that the substrate temperature during the application of the coating be maintained between 700 degrees Centigrade and 850 degrees Centigrade. The resultant product is a diamond coated cutting tool. If the diamond coating is applied at a temperature of greater than 850 degrees Centigrade, the adhesion of the coating is decreased since there is significant cobalt diffusion to the surface of the substrate.

Specific samples of re-sintered substrates and treated substrates were made to demonstrate the differences between the re-sintered substrate and the treated substrate. In this regard, two different runs were done so as to produce two different sets of re-sintered substrates. Some of the re-sintered substrates from each run were chemically treated so as to produce treated substrates, which are identified as inventive substrates. Some of the re-sintered substrates were not treated any further and are identified as comparative samples. The composition of all of these samples, both the inventive samples and the comparative samples, comprised a starting powder that comprised about 6 weight percent cobalt and the balance tungsten and carbon wherein most of the tungsten and carbon was in the form of tungsten carbide. The bulk average grain size of the tungsten carbide grains was between about 3 micrometers and about 13 micrometers as determined by the Roebuck et al. technique.

The starting powder mixture was blended with a lubricant and fugitive binder, and then pressed into a green compact that had partial density. The green compact was then sintered so as to form a substantially dense sintered substrate. The sintered substrate was then re-sintered according to the following parameters: a temperature of about 2800 degrees Fahrenheit (about 1538 degrees Centigrade) for a duration of about 3 hours or about 4 hours at a pressure of about 1.5 torr nitrogen. The resultant product was a re-sintered substrate. The comparative examples comprised re-sintered substrates.

Some of the re-sintered substrates were then subjected to a chemical treatment in the form of an electropolish quick dip. The electropolish quick dip comprised dipping the re-sintered substrate in the Hydrite 4000 solution as described above. The electric current was 1 amp for 30 seconds. These substrates were rinsed and washed with water and sodium hydroxide and then dried.

The substrates were then subjected to an ultrasonic diamond seeding (or scratching) treatment. The resultant product was a treated substrate.

Table I below identifies the re-sintering parameters of temperature and duration, as well as the parameters of the electropolish quick dip (if applicable). Table I sets out the ratio (Co/W) cobalt peak height (Co-K-alpha) and tungsten peak height (W-L-alpha) at the surface of these substrates wherein the values were taken at an edge location near the nose of the substrate and at another location in the center of the rake surface of the substrate. Table I also presents the surface roughness in microinches, $R_a$, for the rake surface. For each one of the samples, Table I also matches up the photomicrographs (FIGS. 3A–14) and the EDS spectra (FIGS. 3C through 14A).

TABLE I

Cobalt/Tungsten Ratio and Surface Roughness
For Comparative Samples and Inventive Samples

Figure 3A:
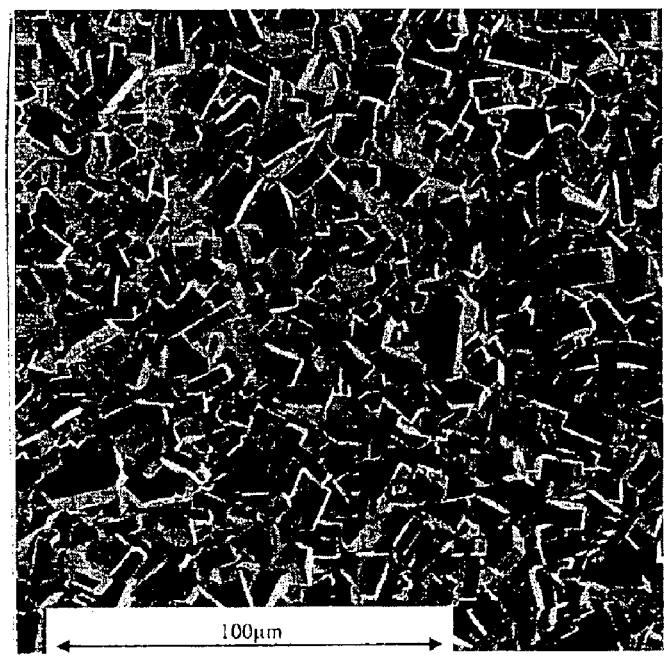
FIG. 3A is a scanning electron photomicrograph having a 100 micrometer scale taken of the edge adjacent the nose of a comparative sample.
Figure 3B:
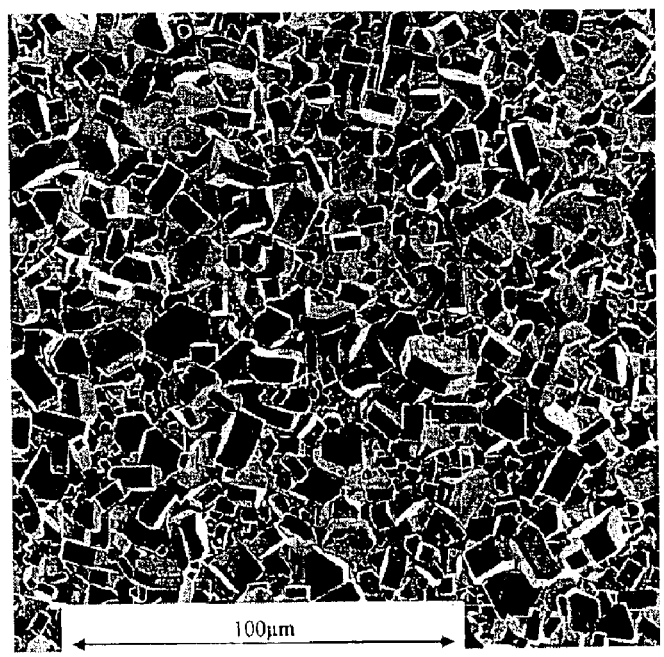
FIG. 3B is a scanning electron photomicrograph having a 100 micrometer scale taken at the center of the rake surface of the comparative sample of FIG. 3A.
Figure 3C:
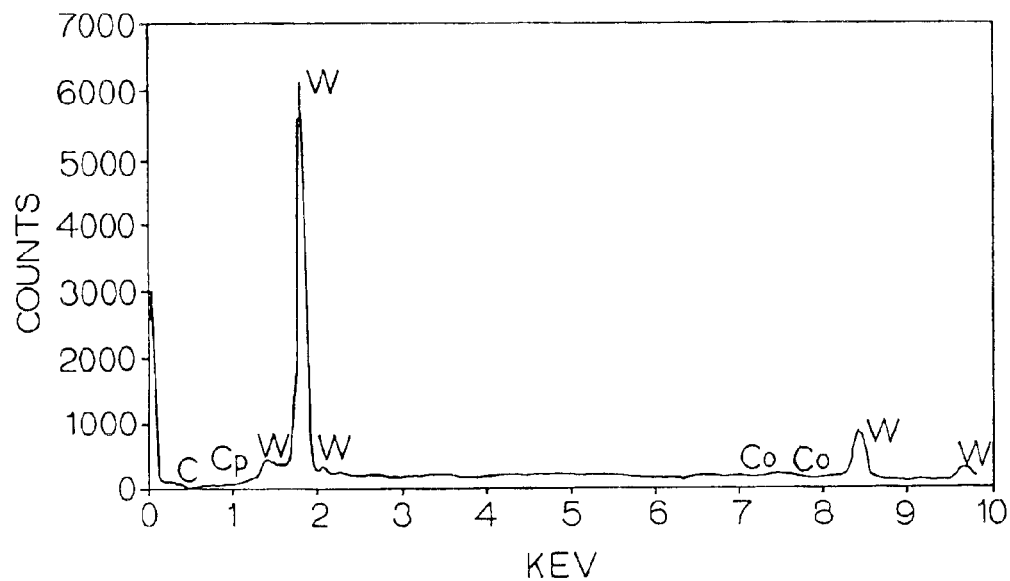
FIG. 3C is an Energy Dispersive Spectroscopy (EDS) spectrum taken at the edge adjacent the nose of the comparative sample of FIG. 3A.
Figure 3D:
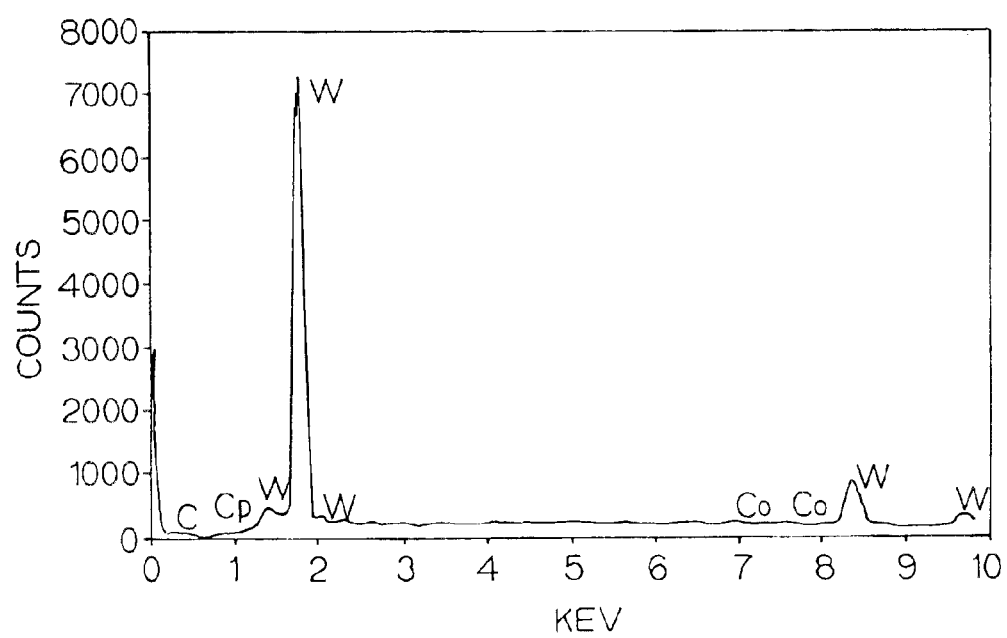
FIG. 3D is an EDS spectrum taken at the center of the rake surface of the comparative sample of FIG. 3A.
Figure 4A:
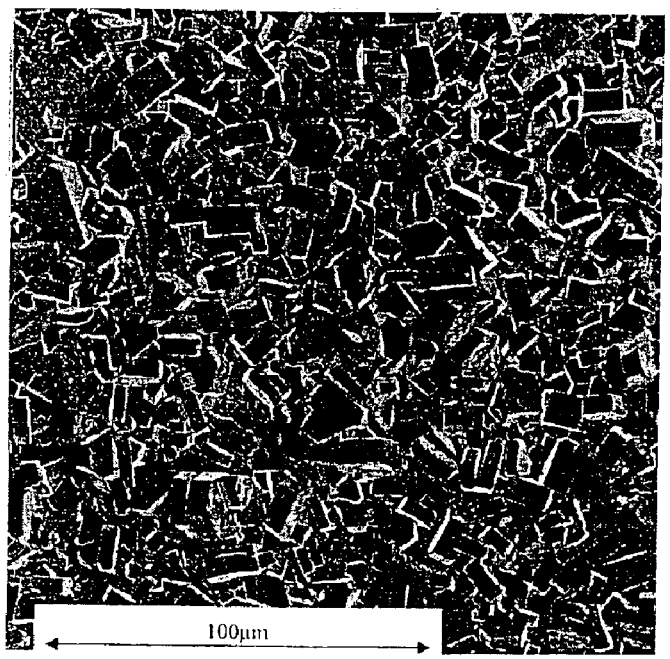
FIG. 4A is a scanning electron photomicrograph having a 100 micrometer scale taken at the edge adjacent the nose of an inventive sample.
Figure 4B:
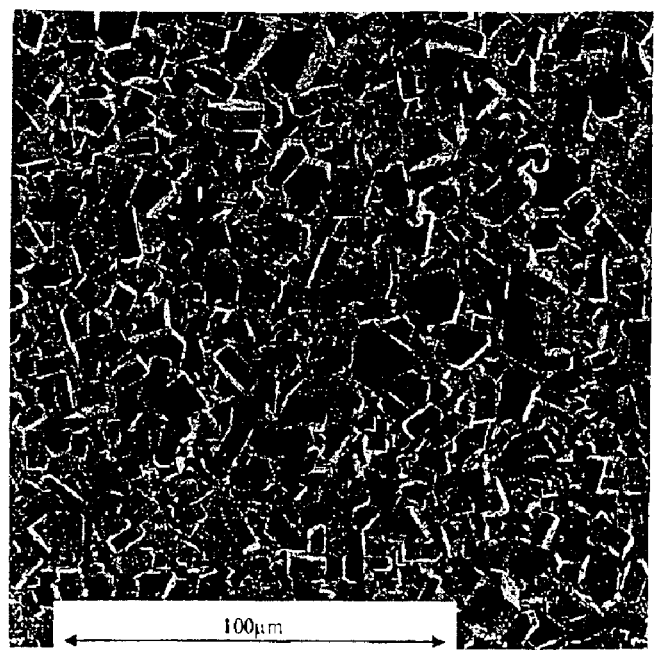
FIG. 4B is a scanning electron photomicrograph having a 100 micrometer scale taken at the center of a rake surface of the inventive sample of FIG. 4A.
Figure 4C:
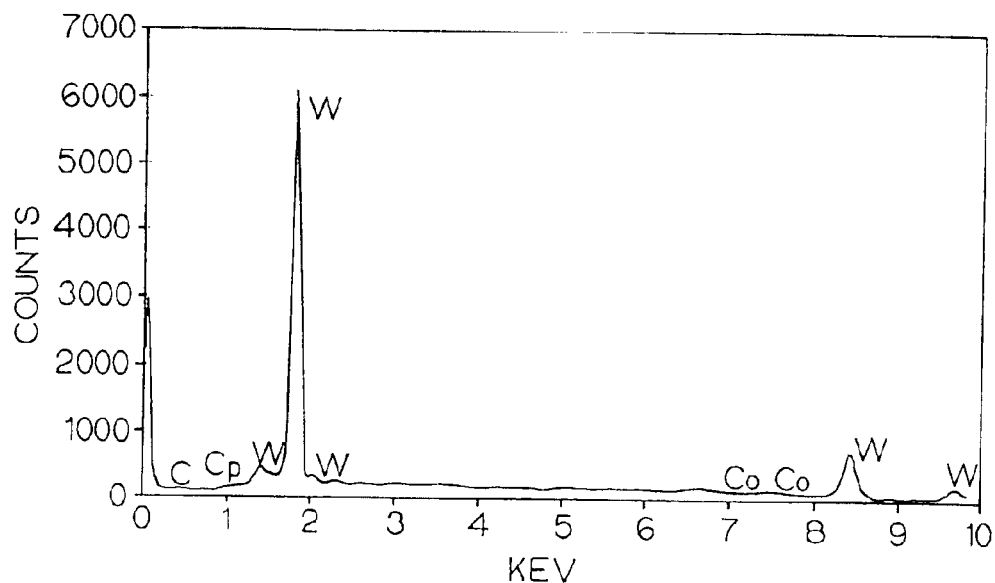
FIG. 4C is an EDS spectrum taken at the edge adjacent to the nose of the inventive sample of FIG. 4A.
Figure 4D:
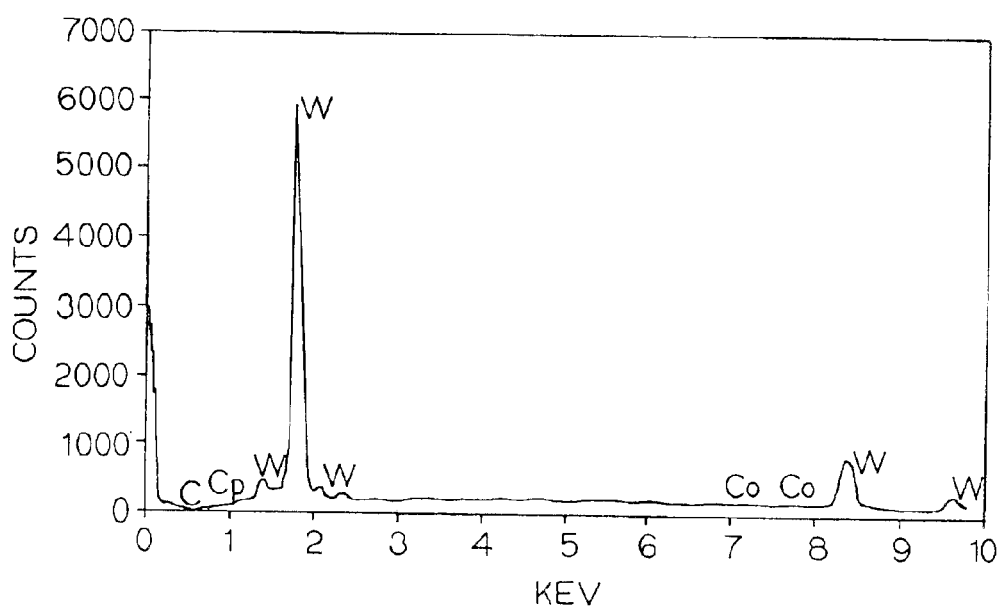
FIG. 4D is an EDS spectrum taken at the center of the rake surface of the inventive sample of FIG. 4A.
Figure 5A:
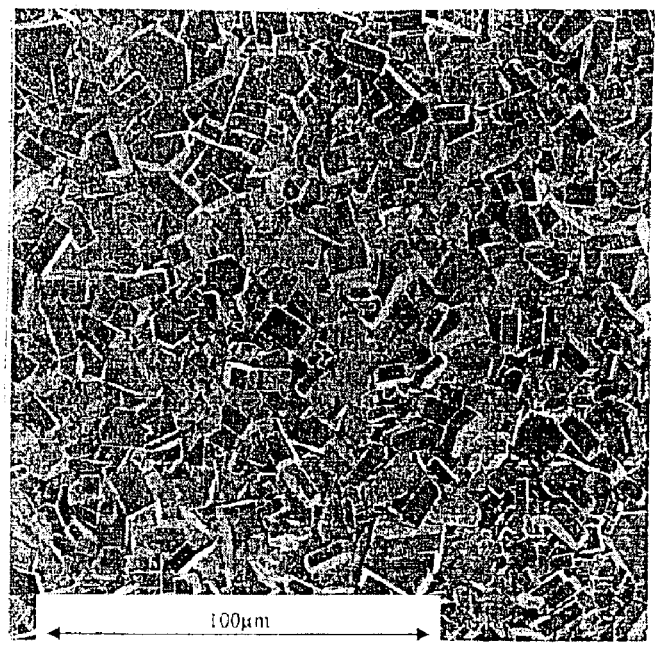
FIG. 5A is a scanning electron photomicrograph having a 100 micrometer taken at the edge adjacent the nose of a comparative sample.
Figure 5B:
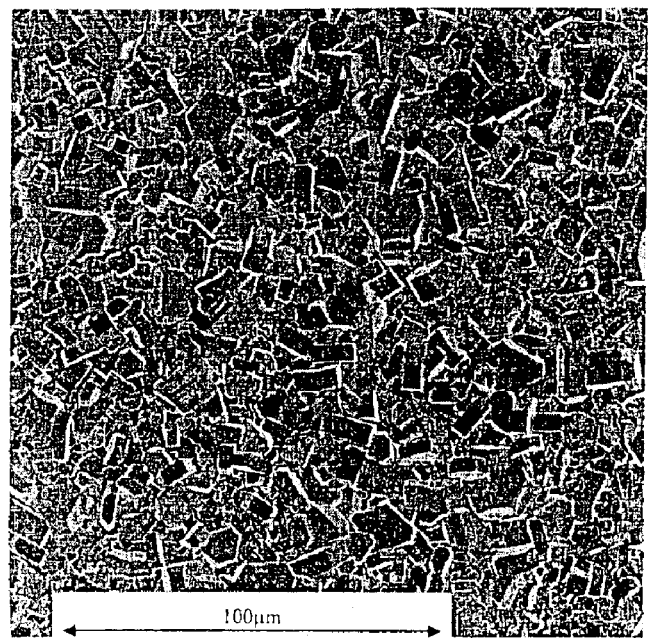
FIG. 5B is a scanning electron photomicrograph having a 100 micrometer scale taken at the center of the rake surface of the comparative sample of FIG. 5A.
Figure 5C:
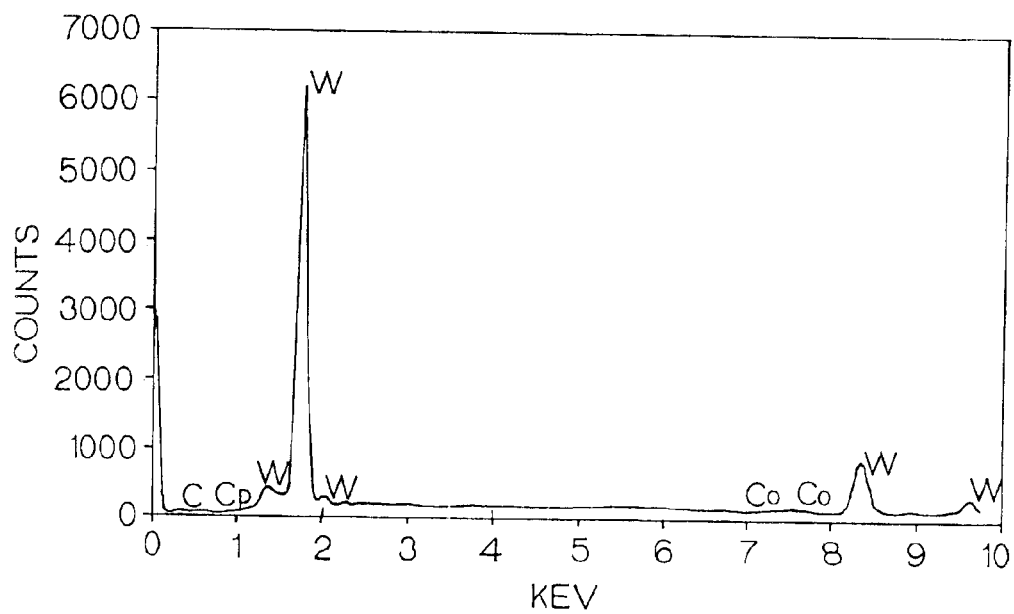
FIG. 5C is an EDS spectrum taken at the edge adjacent to the nose of the comparative sample of FIG. 5A.
Figure 5D:
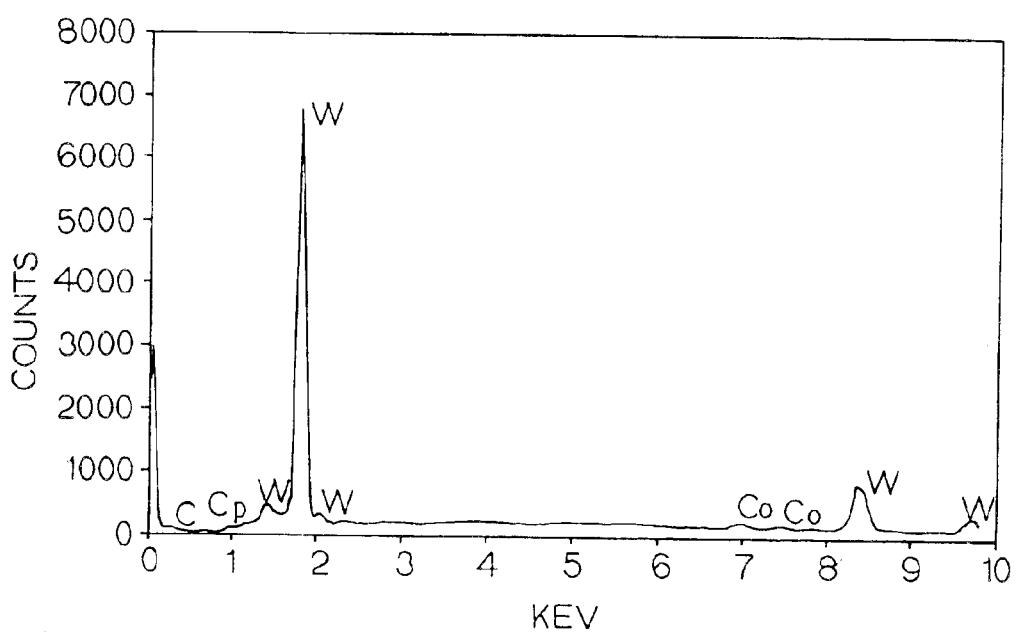
FIG. 5D is an EDS spectrum taken at the center of the rake surface of the comparative sample of FIG. 5A.
Figure 6A:
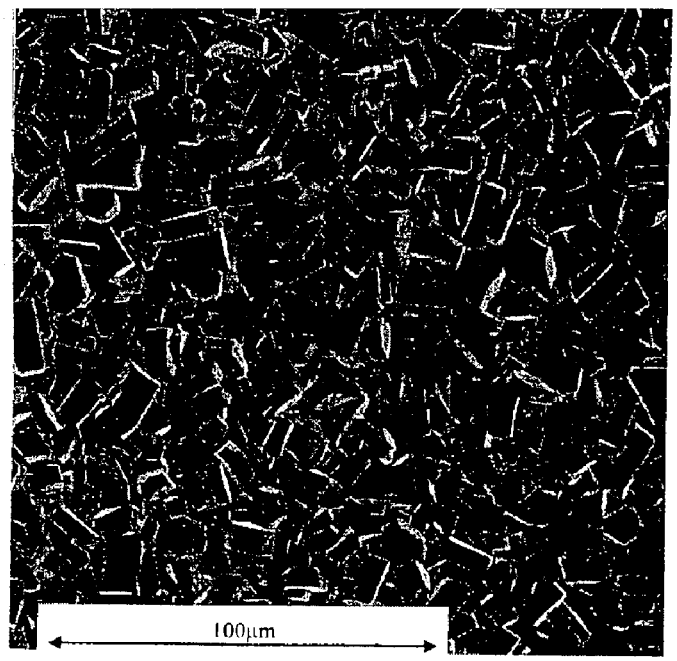
FIG. 6A is a scanning electron photomicrograph having a 100 micrometer scale taken at the edge adjacent the nose of an inventive sample.
Figure 6B:
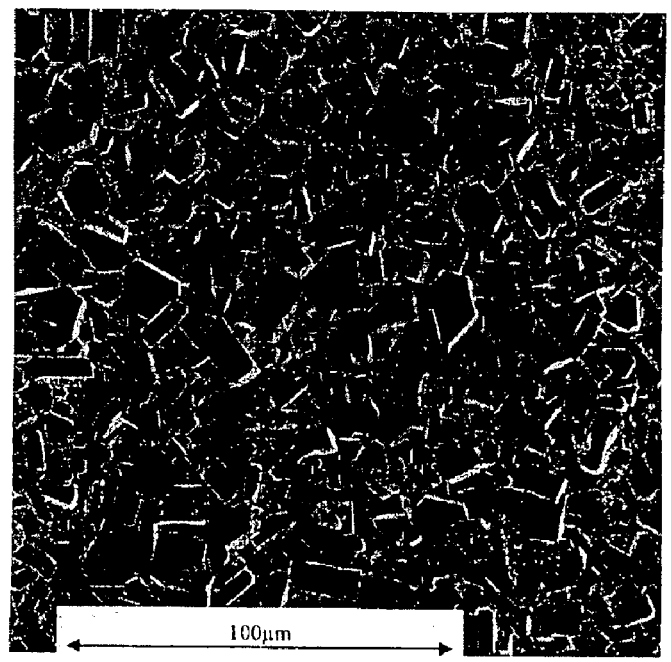
FIG. 6B is a scanning electron photomicrograph having a 100 micrometer scale taken at the center of the rake surface of the inventive sample of FIG. 6A.
Figure 6C:
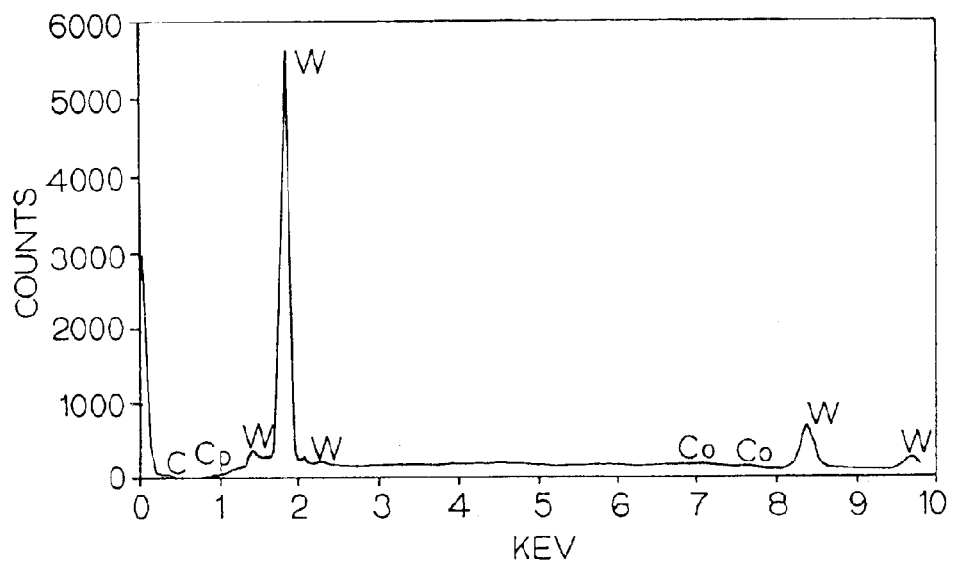
FIG. 6C is an EDS spectrum taken at the edge adjacent the nose of the inventive sample of FIG. 6A.
Figure 6D:
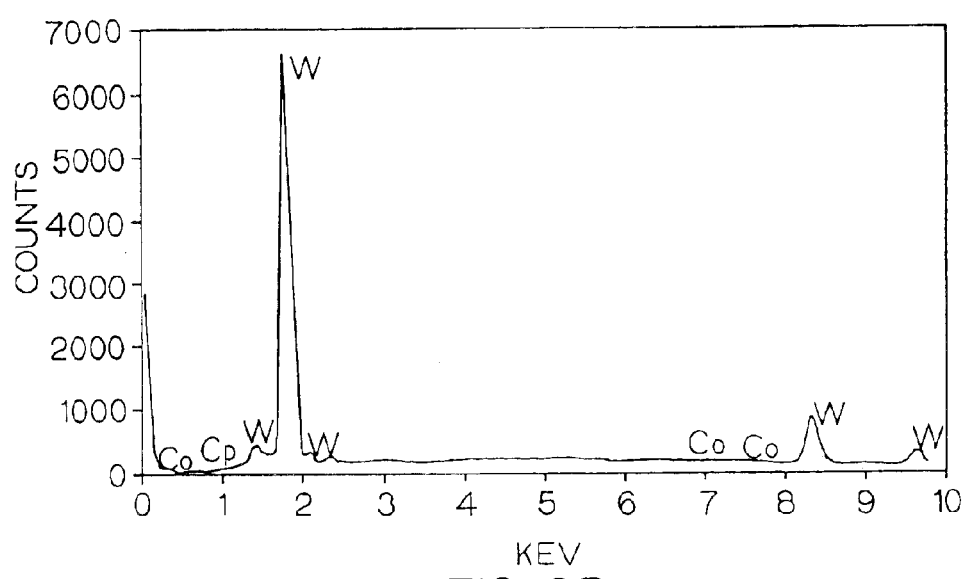
FIG. 6D is an EDS spectrum taken at the center of the rake surface of the inventive sample of FIG. 6A.
Figure 7A:
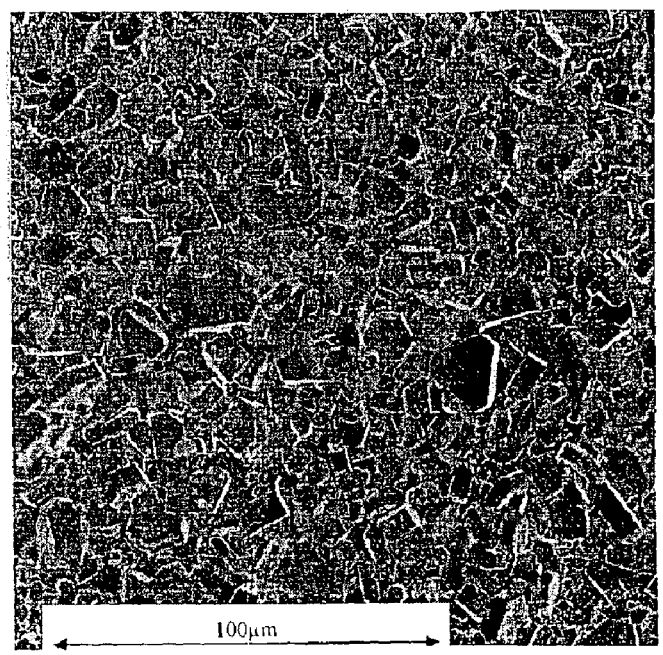
FIG. 7A is a scanning electron photomicrograph having a 100 micrometer scale taken at the edge adjacent the nose of a comparative sample.
Figure 7B:
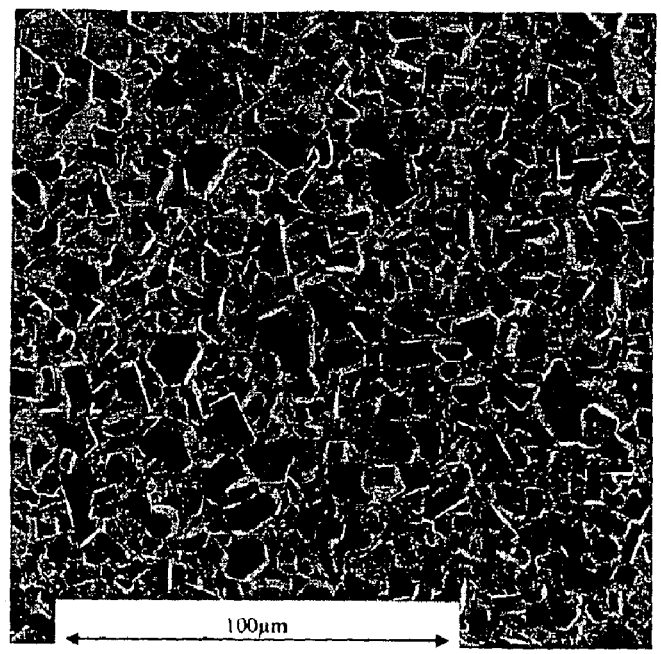
FIG. 7B is a scanning electron photomicrograph having a 100 micrometer scale taken at the center of the rake surface of the comparative sample of FIG. 7A.
Figure 7C:
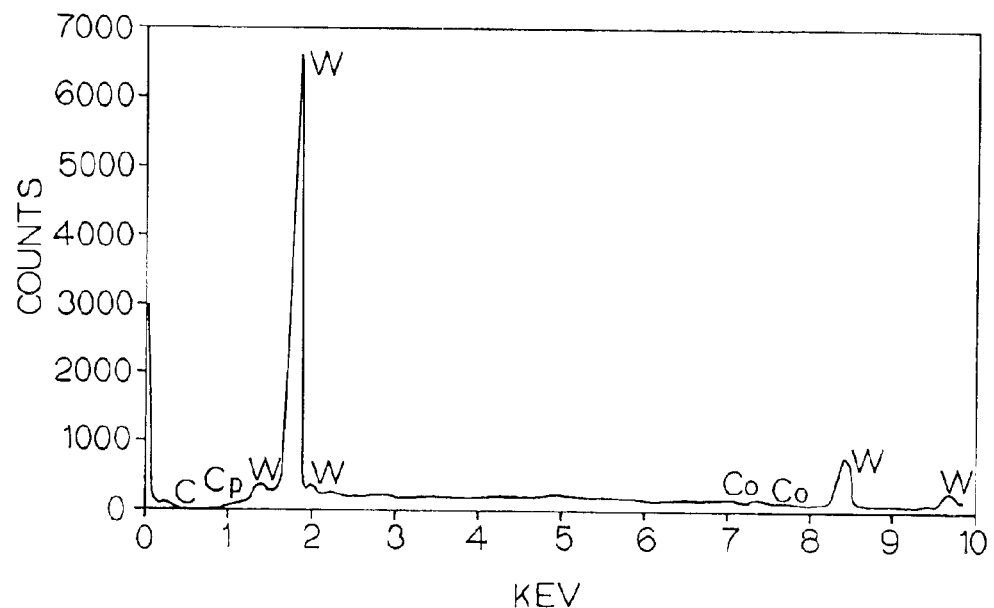
FIG. 7C is an EDS spectrum taken at the edge adjacent the nose of the comparative sample of FIG. 7A.
Figure 7D:
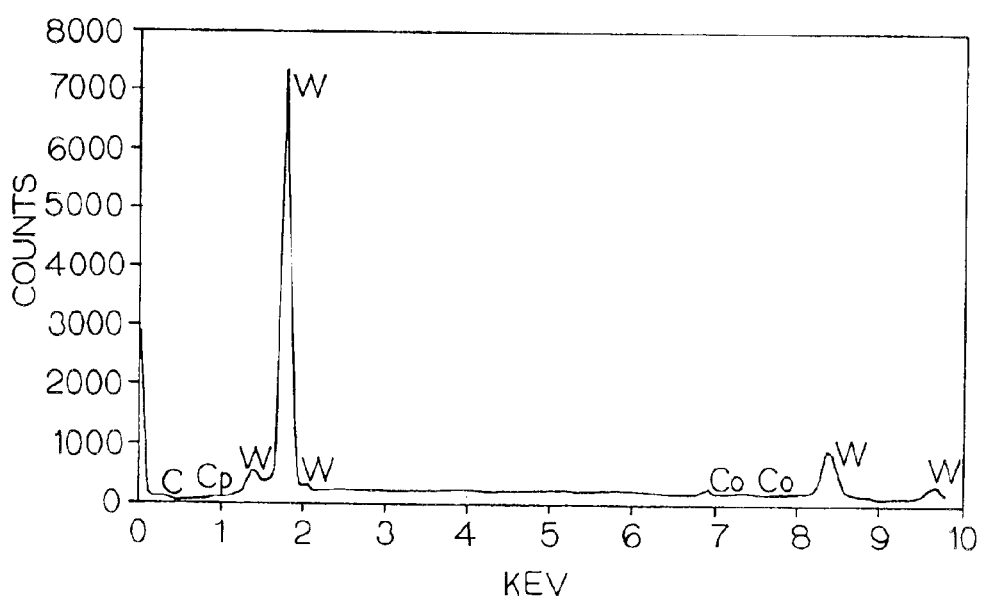
FIG. 7D is an EDS spectrum taken at the center of the rake surface of the comparative sample of FIG. 7A.
Figure 8A:
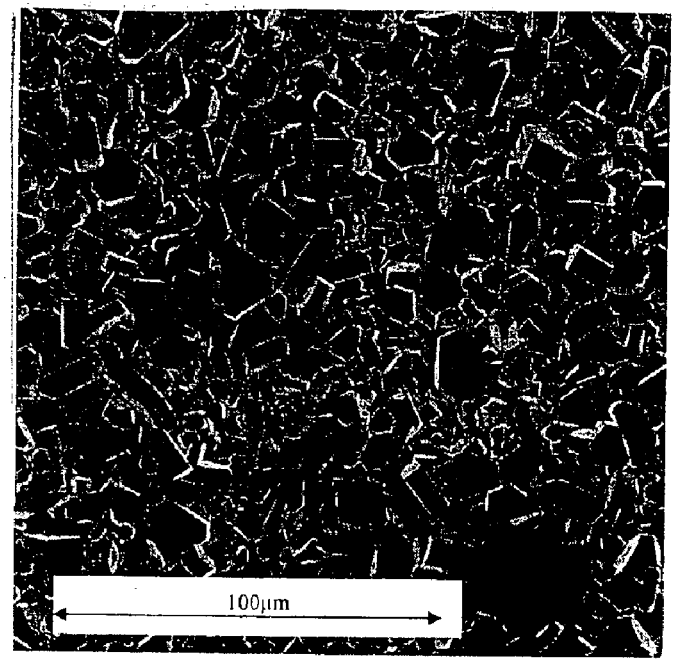
FIG. 8A is a scanning electron photomicrograph having a 100 micrometer scale taken at the edge adjacent to the nose of an inventive sample.
Figure 8B:
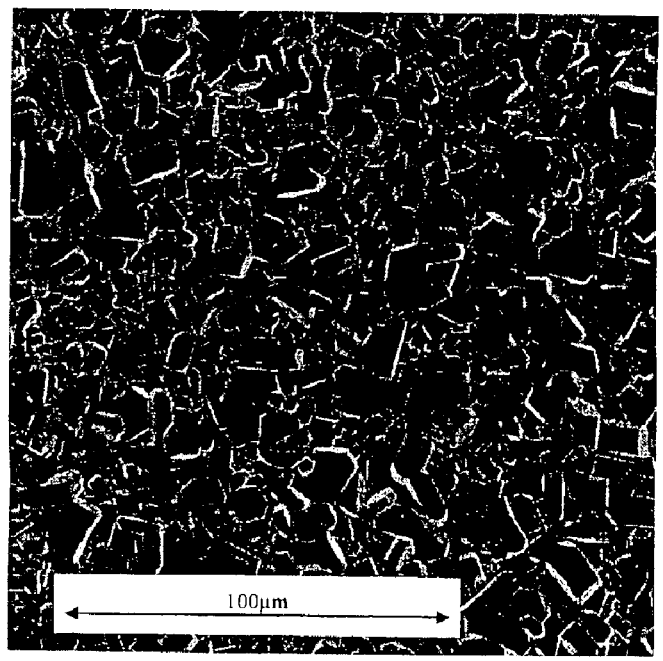
FIG. 8B is a scanning electron photomicrograph having a 100 micrometer scale taken at the center of the rake surface of the inventive sample of FIG. 8A.
Figure 8C:
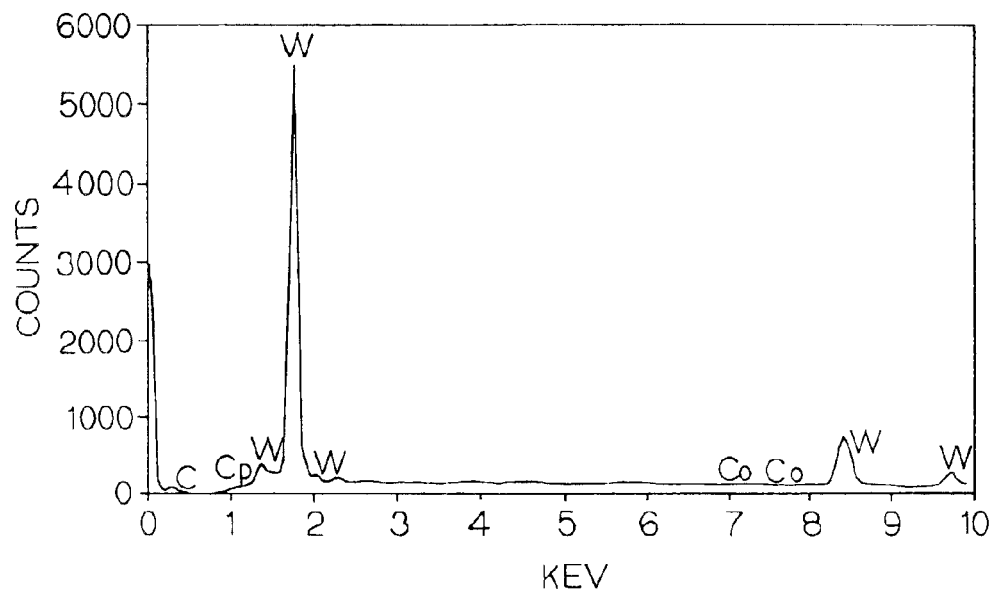
FIG. 8C is an EDS spectrum taken at the edge adjacent the nose of the inventive sample of FIG. 8A.
Figure 8D:
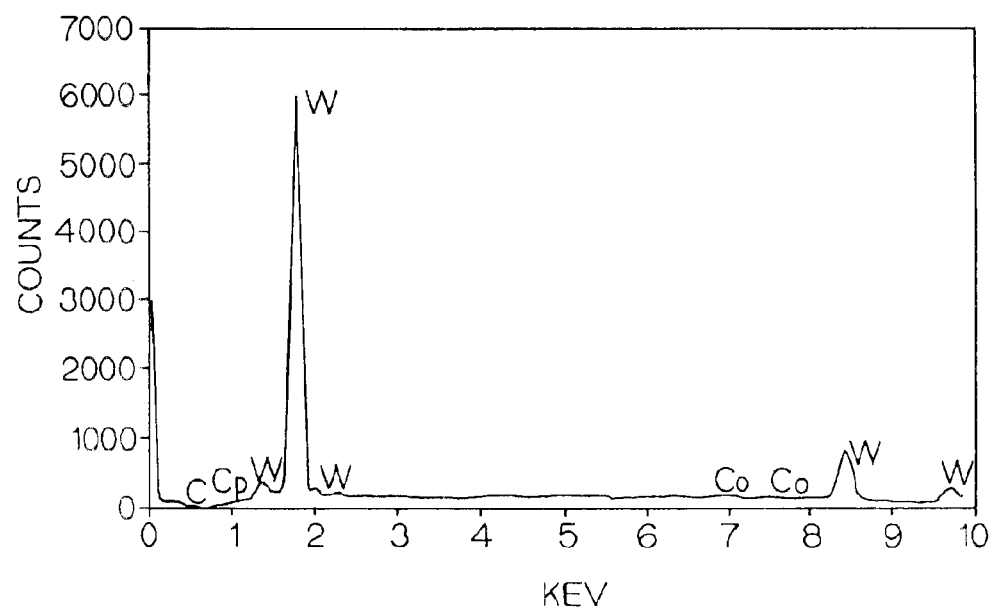
FIG. 8D is an EDS spectrum taken at the center of the rake surface of the inventive sample of FIG. 8A.
Figure 9A:
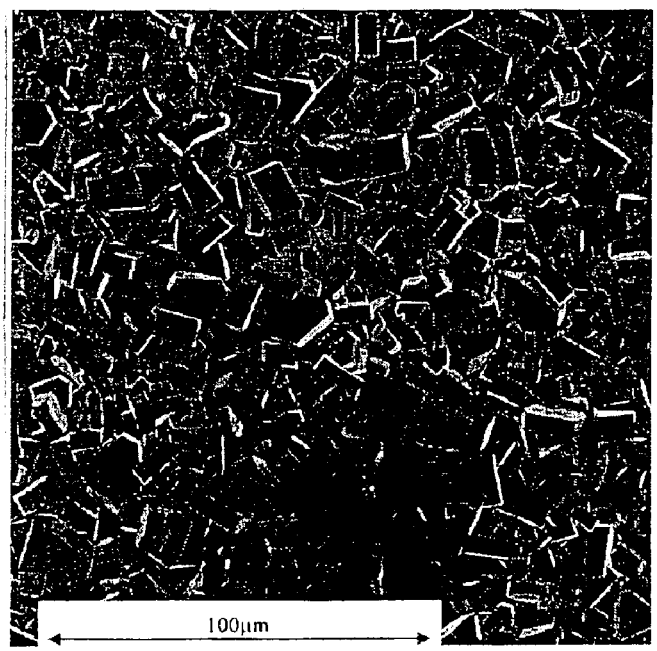
FIG. 9A is a scanning electron photomicrograph having a 100 micrometer scale taken at the edge adjacent to the nose of a comparative sample.
Figure 9B:
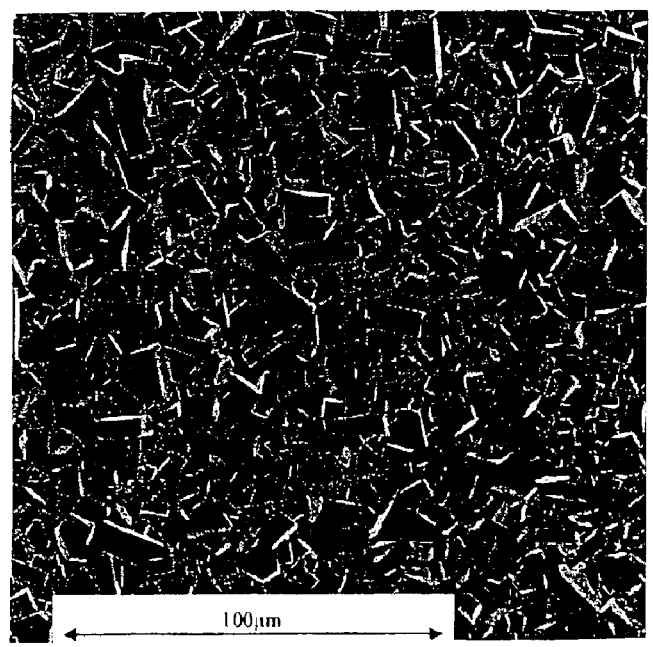
FIG. 9B is a scanning electron photomicrograph having a 100 micrometer scale taken at the center of the rake surface of the comparative sample of FIG. 9A.
Figure 9C:
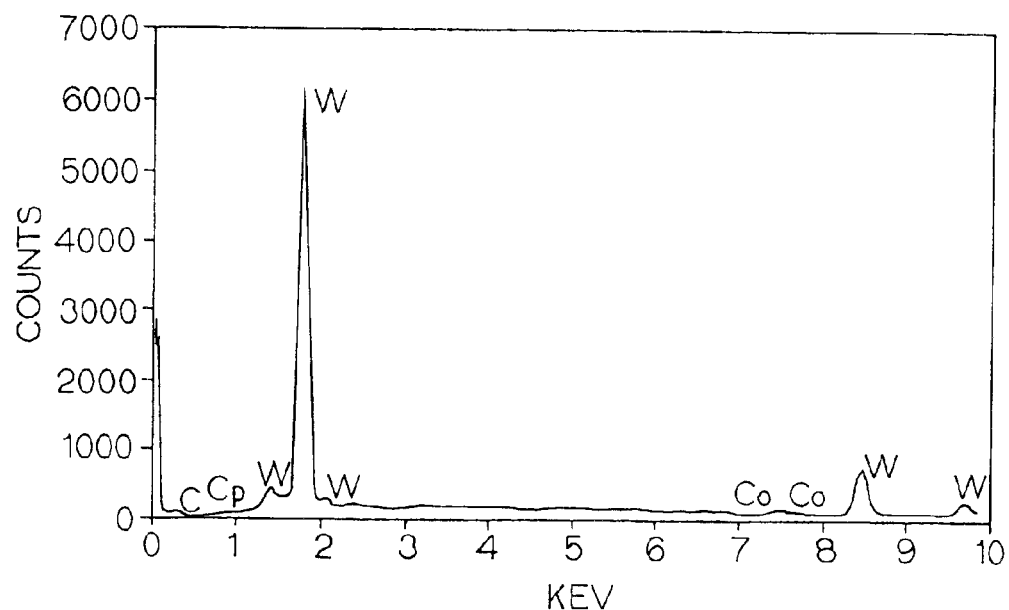
FIG. 9C is an EDS spectrum taken at the edge adjacent the nose of the comparative sample of FIG. 9A.
Figure 9D:
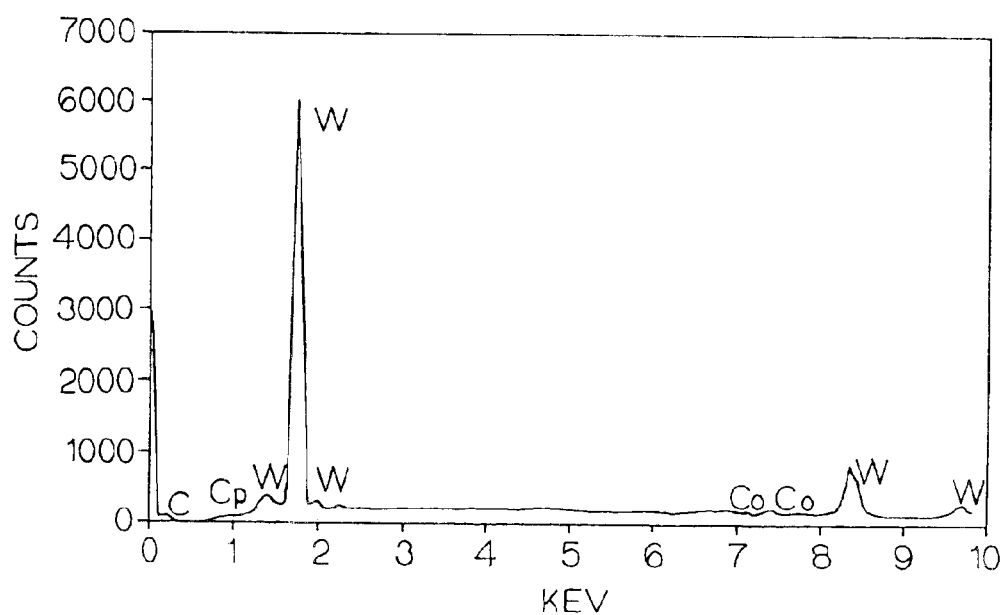
FIG. 9D is an EDS spectrum taken at the center of the rake surface of the comparative sample of FIG. 9A.
Figure 10A:
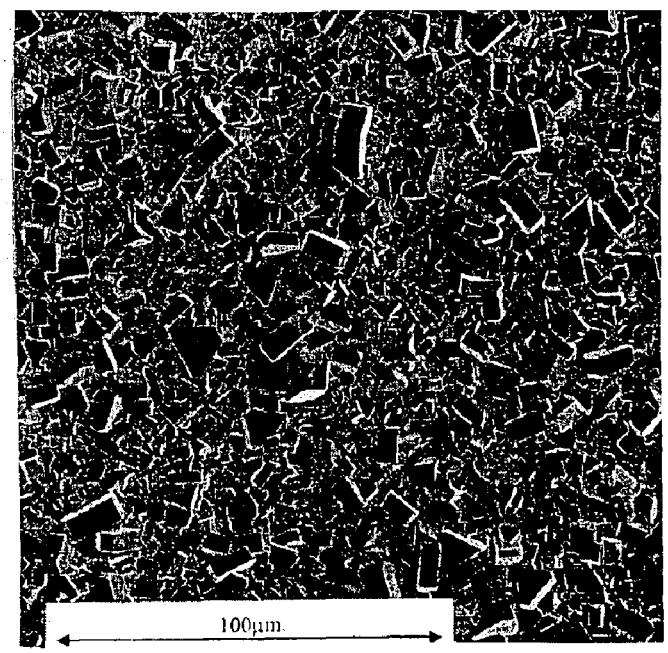
FIG. 10A is a scanning electron photomicrograph having a 100 micrometer scale taken at the edge adjacent to the nose of an inventive sample.
Figure 10B:
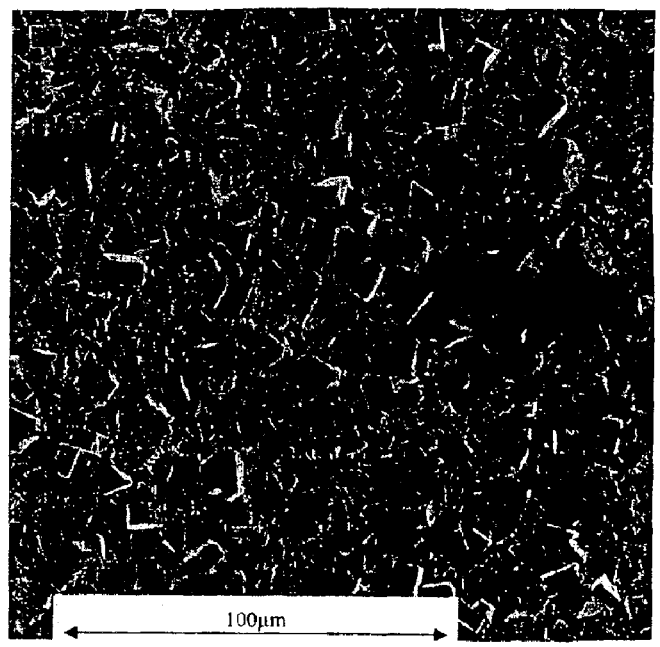
FIG. 10B is a scanning electron photomicrograph having a 100 micrometer scale taken at the center of the rake surface of the inventive sample of FIG. 10A.
Figure 10C:
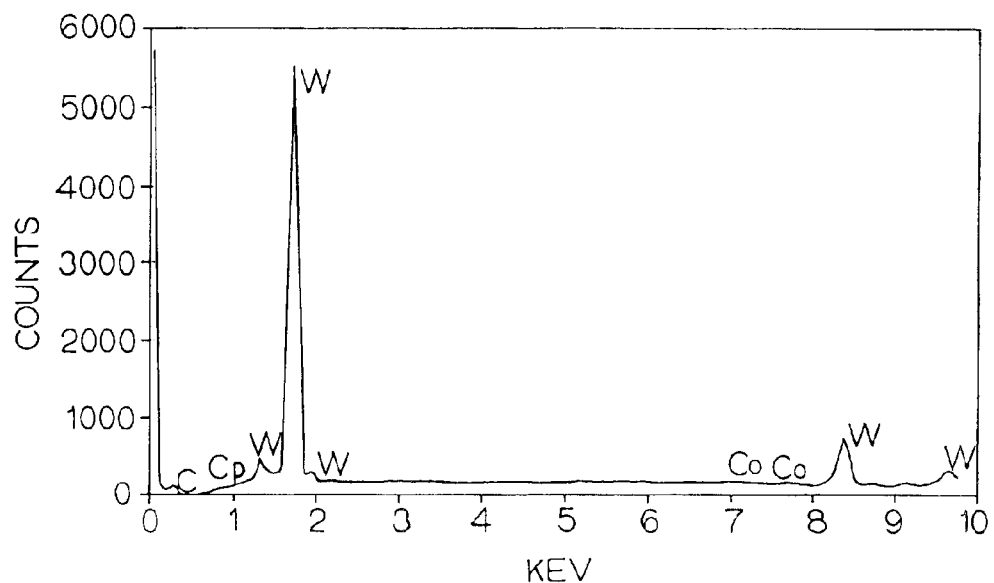
FIG. 10C is an EDS spectrum taken at the edge adjacent the nose of the inventive sample of FIG. 10A.
Figure 10D:
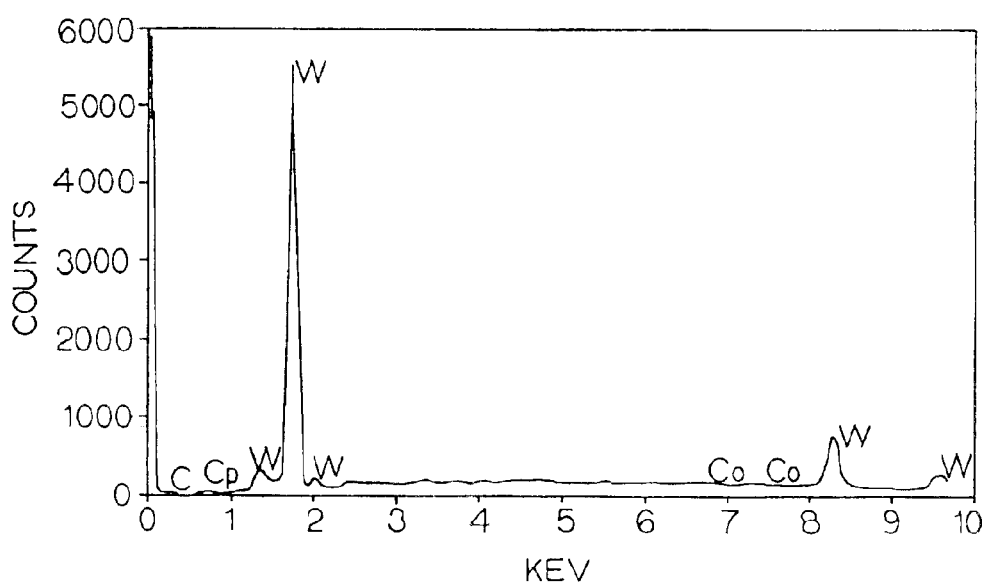
FIG. 10D is an EDS spectrum taken at the center of the rake surface of the inventive sample of FIG. 10A.
Figure 11A:
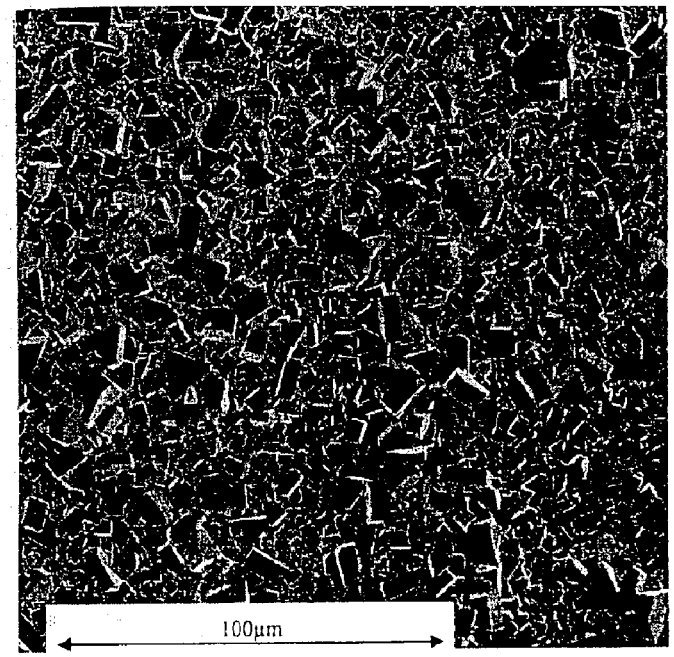
FIG. 11A is a scanning electron photomicrograph having a 100 micrometer scale taken at the edge adjacent the nose of a comparative sample.
Figure 11B:
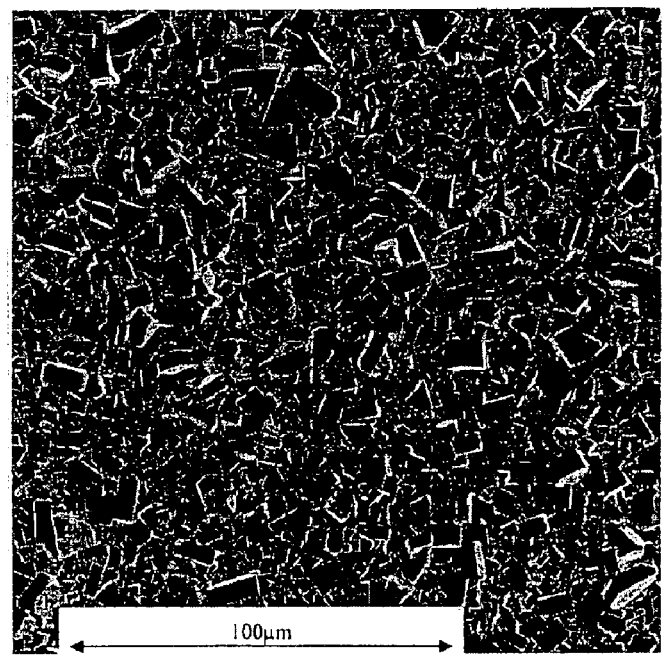
FIG. 11B is a scanning electron photomicrograph having a 100 micrometer scale taken at the center of the rake surface of the comparative sample of FIG. 11A.
Figure 11C:
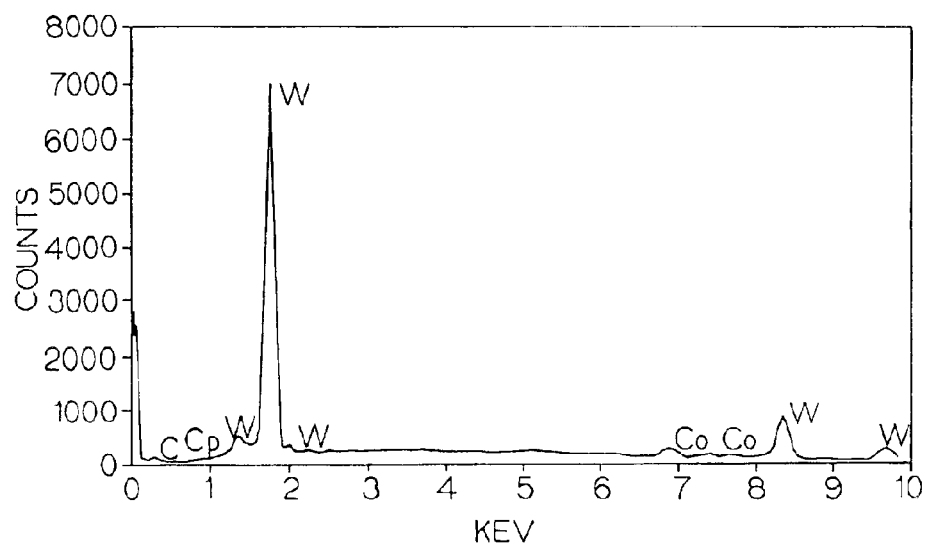
FIG. 11C is an EDS spectrum taken at the edge adjacent the nose of the comparative sample of FIG. 11A.
Figure 11D:
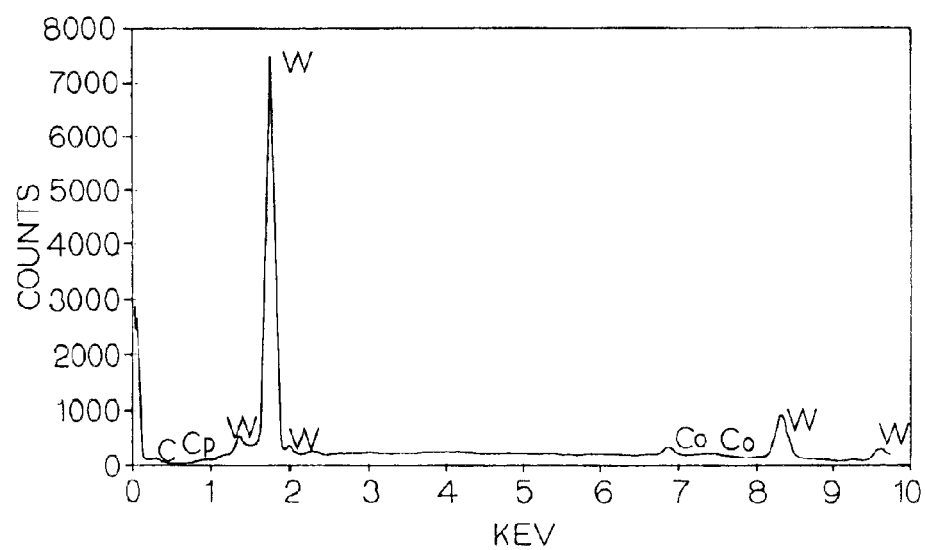
FIG. 11D is an EDS spectrum taken at the center of the rake surface of the comparative sample of FIG. 11A.
Figure 12A:
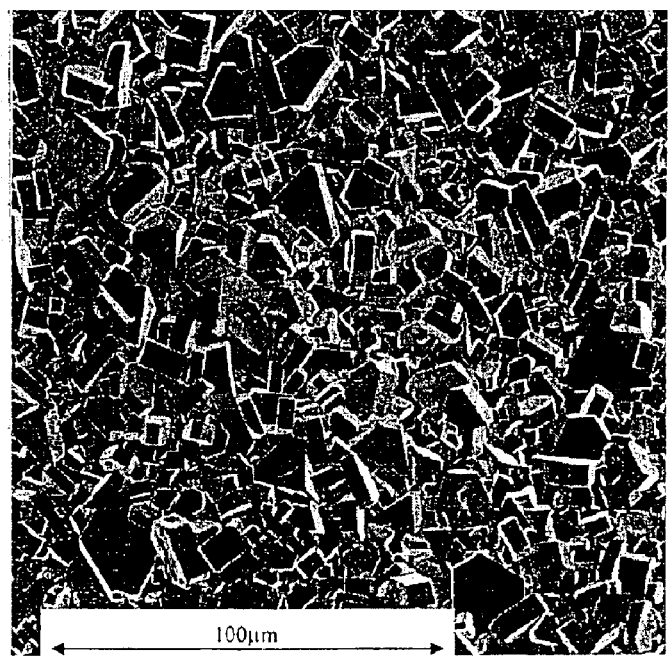
FIG. 12A is a scanning electron photomicrograph having a 100 micrometer scale taken at the edge adjacent to the nose of an inventive sample.
Figure 12B:
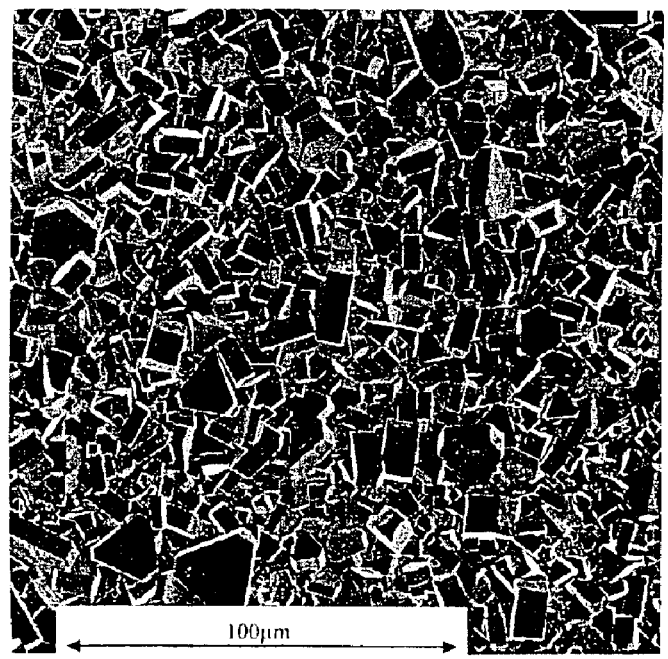
FIG. 12B is a scanning electron photomicrograph having a 100 micrometer scale taken at the center of the rake surface of the inventive sample of FIG. 12A.
Figure 12C:
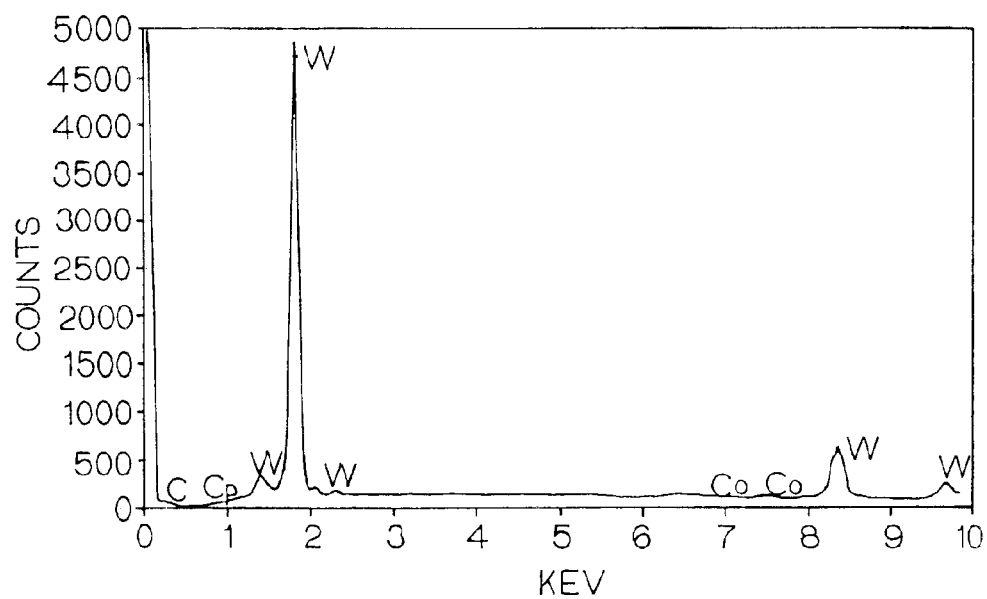
FIG. 12C is an EDS spectrum taken at the edge adjacent the nose of the inventive sample of FIG. 12A.
Figure 12D:
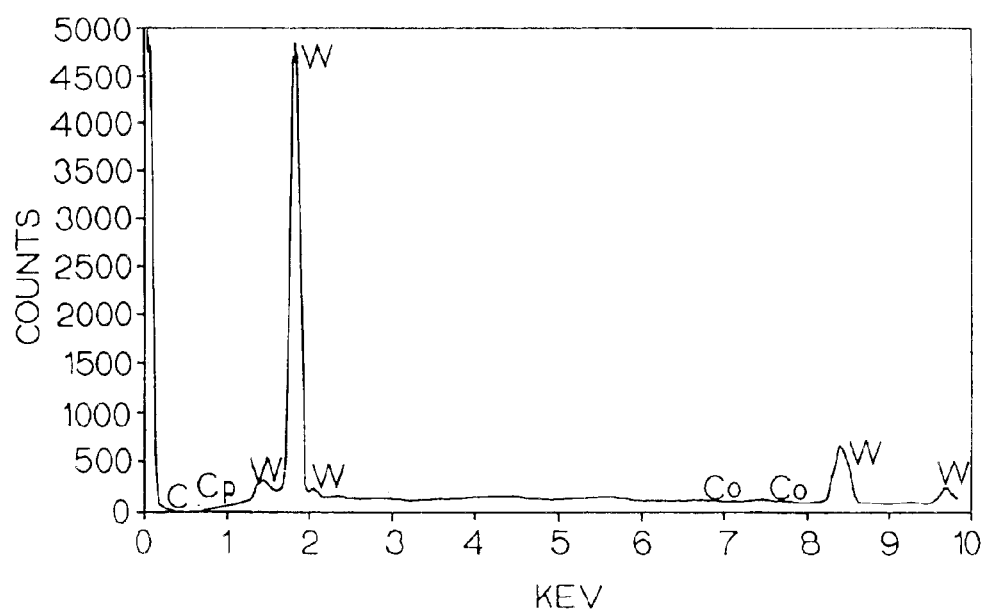
FIG. 12D is an EDS spectrum taken at the center of the rake surface of the inventive sample of FIG. 12A.
Figure 13A:
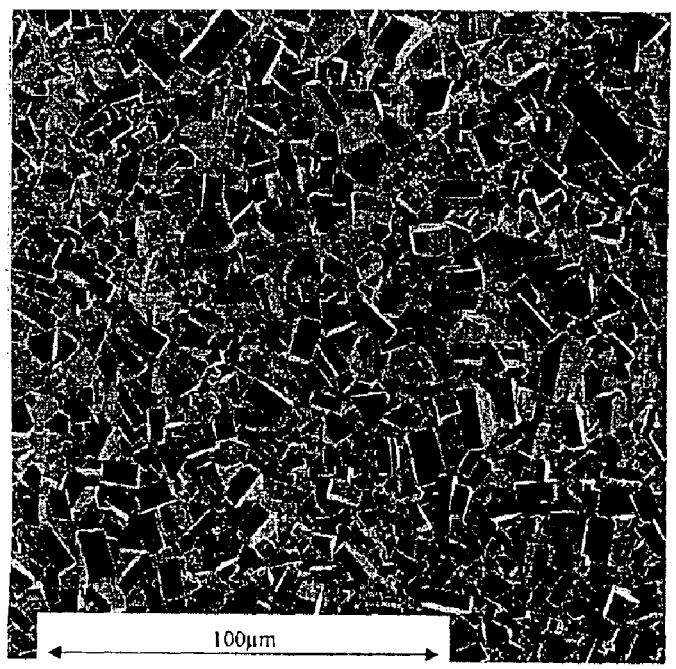
FIG. 13A is a scanning electron photomicrograph having a 100 micrometer scale taken at the edge adjacent to the nose of a comparative sample.
Figure 13B:
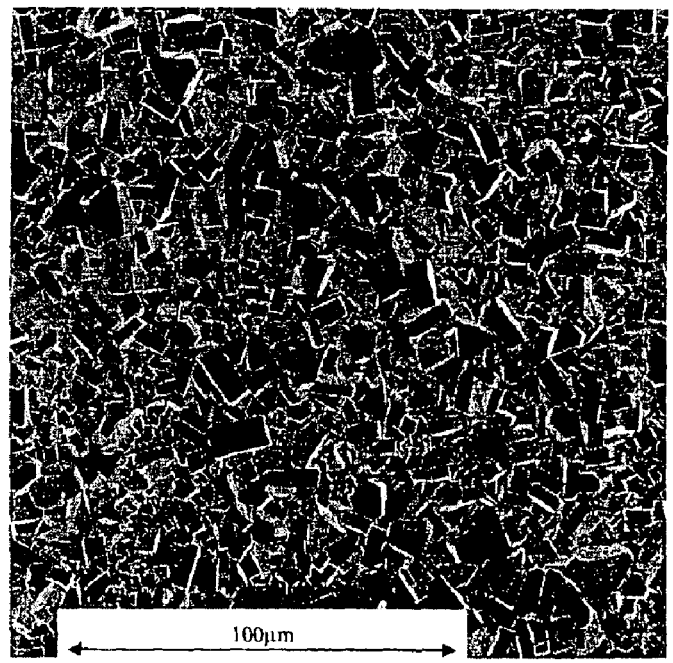
FIG. 13B is a scanning electron photomicrograph having a 100 micrometer scale taken at the center of the rake surface of the comparative sample of FIG. 13A.
Figure 13C:
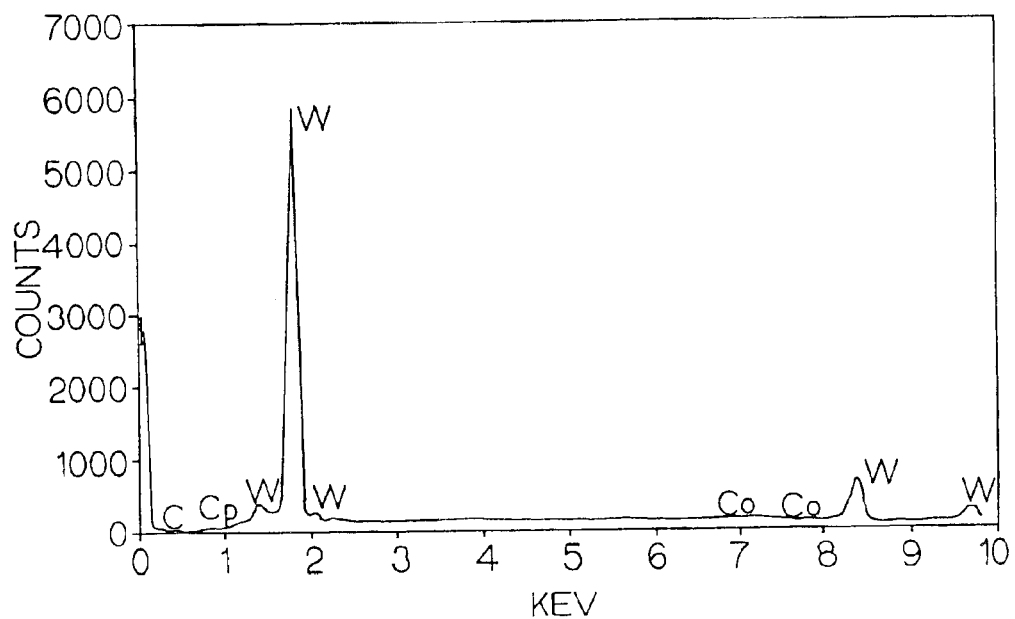
FIG. 13C is an EDS spectrum taken at the edge adjacent the nose of the comparative sample of FIG. 13A.
Figure 13D:
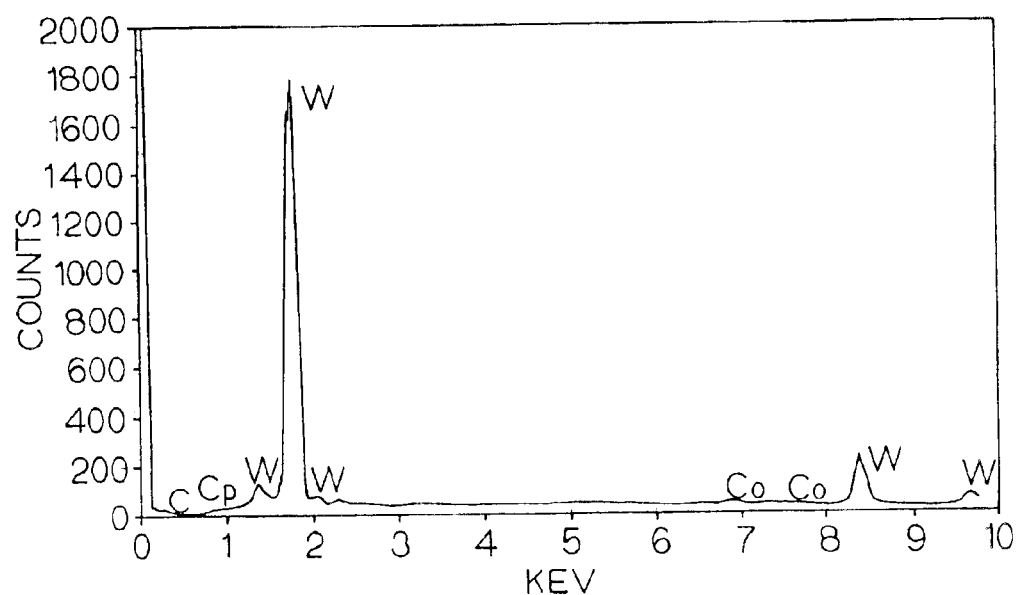
FIG. 13D is an EDS spectrum taken at the center of the rake surface of the comparative sample of FIG. 13A.
Figure 14:
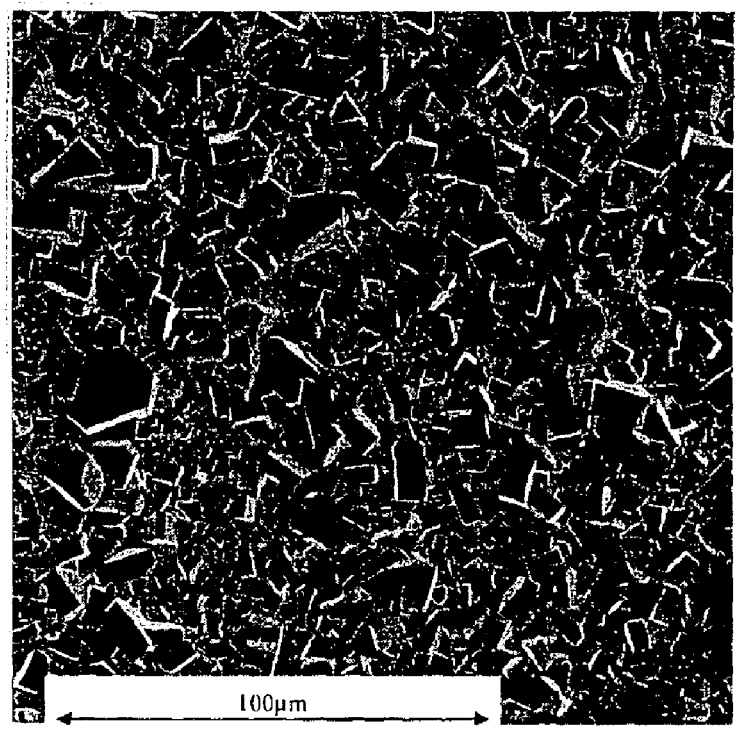
FIG. 14 is a scanning electron photomicrograph having a 100 micrometer scale taken at the center of the rake surface of an inventive sample.
Figure 14A:
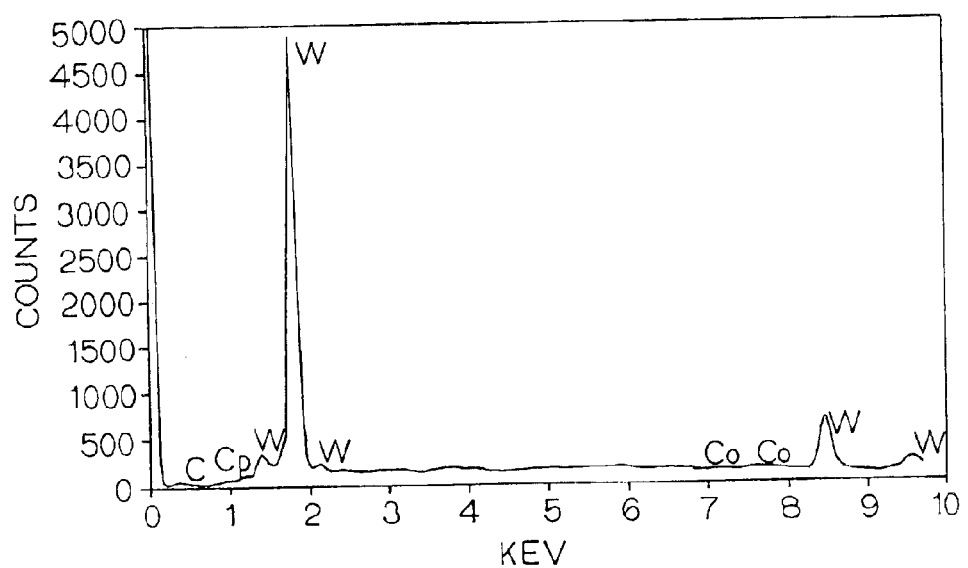
FIG. 14A is an EDS spectrum taken at the center of the rake surface of the inventive sample of FIG. 14.

| Sample & Processing | EDS Spectrum | Co/W Peak Ratio at Edge adjacent Nose/ Center of Rake Surface | Surface Roughness Microinches, $R_a$/Rake Surface | Photomicrographs (Edge adjacent Nose & Center of Rake Surface) |
|---|---|---|---|---|
| Comparative/Re-sinter at 2800° F. for 3 hrs | FIGS. 3C & 3D | 0.03/0.07 | 57.68 | FIG. 3A & FIG. 3B |
| Inventive/Re-sinter at 2800° F. for 3 hrs. & Electro Dip [1 amp for 30 seconds] | FIGS. 4C & 4D | 0.02/0.02 | 68.32 | FIG. 4A & 4B |
| Comparative/Re-sinter at 2800° F. for 3 hrs. | FIGS. 5C & 5D | 0.02/0.08 | 63.22 | FIG. 5A & 5B |
| Inventive/Re-sinter at 2800° F. for 3 hrs. & Electro Dip [1 amp for 30 seconds] | FIGS. 6C & 6D | 0.01/0.04 | 53.85 | FIG. 6A & 6B |
| Comparative/Re-sinter at 2800° F. for 3 hrs. | FIGS. 7C & 7D | 0.04/0.08 | 62.56 | FIG. 7A & 7B |
| Inventive/Re-sinter at 2800° F. for 4 hrs | FIGS. 8C & 8D | 0.01/0.03 | 59.02 | FIG. 8A & 8B |
| Comparative/Re-sinter at 2800° F. for 4 hrs | FIGS. 9C & 9D | 0.01/0.06 | 73.79 | FIG.9A & 9B |
| Inventive/Re-sinter at 2800° F. for 4 hrs. & Electro Dip [1 amp for 30 seconds] | FIGS. 10C & 10D | 0.01/0 | 57.11 | FIG. 10A & 10B |
| Comparative/Re-sinter at 2800° F. 4 hrs. | FIGS. 11C & 11D | 0.01/0.20 | 63.98 | FIG. 11A & 11B |
| Inventive/Re-sinter at 2800° F. for 4 hrs. & Electro Dip [1 amp for 30 seconds] | FIGS. 12C & 12D | 0.01/0.03 | 63.94 | FIG. 12A & 12B |
| Comparative/Re-sinter at 2800° F. for 4 hrs. | FIGS. 13C & 13 D | 0.03/0.08 | 55.03 | FIG. 13A & 13B |
| Inventive/Re-sinter at 2800° F. for 4 hrs. & Electro Dip [1 amp for 30 seconds] | FIG. 14A | 0.01/10 | 56.14 | FIG. 14 |

Table II below sets forth the averages of the information presented in Table I above for the samples that were subjected to the re-sintering for 3 hours.

TABLE II

Average Values for Co/W Peak Ratio and Rake Surface Roughness Of Samples Re-Sintered at 2800° F. (1538° C.) for 3 Hours

| Sample | Co/W Peak Ratio Edge Adjacent Nose | Co/W Peak Ratio Center of Rake Surface | Surface Roughness Microinches, $R_a$ of Rake Surface |
|---|---|---|---|
| Comparative [Re-Sintered Substrate] | .030 | .077 | 61.1 |
| Inventive [Treated substrate] | .013 | .030 | 60.4 |

Table III below sets forth the averages of the information presented in Table I above for the samples that were subjected to the re-sintering for 4 hours.

TABLE III

Average Values for Co/W Peak Ratio and Rake Surface Roughness Of Samples Re-Sintered at 2800° F. (1538° C.) for 4 Hours

| Sample | Co/W Peak Ratio Edge Adjacent Nose | Co/W Peak Ratio Center of Rake Surface | Surface Roughness Microinches, $R_a$ of Rake Surface |
|---|---|---|---|
| Comparative [Re-Sintered Substrate] | .07 | .11 | 64.3 |
| Inventive [Treated Substrate] | .01 | .01 | 59.0 |

Referring to the results set forth above, it is very apparent that the Co/W Peak Ratios are reduced through the present invention. In this regard, the average value of the Co/W Peak Ratio at the edge adjacent the nose was reduced from 0.07 to 0.01 through the use of the present invention. The average value of the Co/W Peak Ratio at the center of the rake surface was reduced from 0.11 to 0.01 through the use of the present invention.

As another example there was provided a sintered substrate [K203T] (Sample ASV 556) that had a composition of 0.02–0.03 weight percent tantalum; less than 0.01 weight percent of the following elements: titanium, niobium, nickel, vanadium, chromium, molybdenum, and hafnium; 0.13 weight percent iron, 6.04–6.09 weight percent cobalt; and the balance was tungsten and carbon wherein most of the tungsten and carbon was in the form of tungsten carbide. For the sintered substrate, the magnetic saturation value was 17.82 microtesla cubic meter per kilogram cobalt.

The hardness of the sintered substrate in the bulk region thereof was 89.4 Rockwell A. The grain size of the tungsten carbide in the bulk region was between about 3 micrometers and about 13 micrometers. The porosity of the sintered substrate determined according to ASTM Designation B276–91 (Reapproved 1996) was A02+B00+C00 at the edges and A02+B00.2+C00. There was no eta phase present in the re-sintered substrate.

Figure 15:
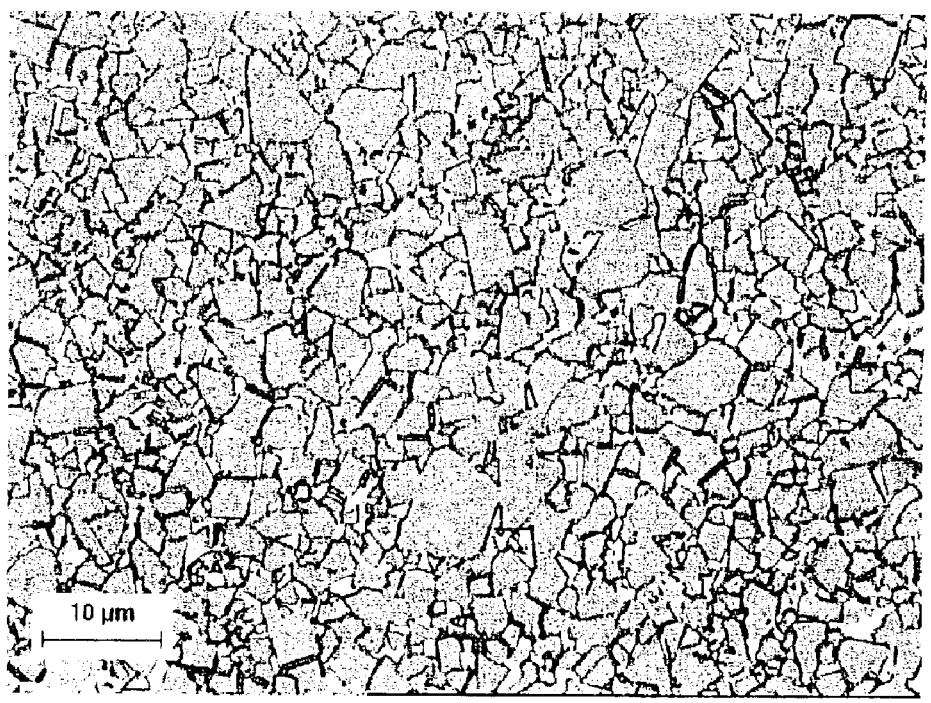
FIG. 15 is a photomicrograph (having a 10 micrometer scale) of the typical microstructure of the sintered substrate of the inventive sample ASV 556 after a two minute etch.

FIG. 15 is a photomicrograph that shows the microstructure of the bulk region of the sintered substrate of this sample (ASV556) after a two minute etching treatment. The microstructure is typical except for a few larger size grains of tungsten carbide.

The substrate was sintered by itself (i.e., no materials of differing composition were included) at a temperature of about 2700 degrees Fahrenheit (about 1482 degrees Centigrade) for a duration of 45 minutes.

Figure 17:
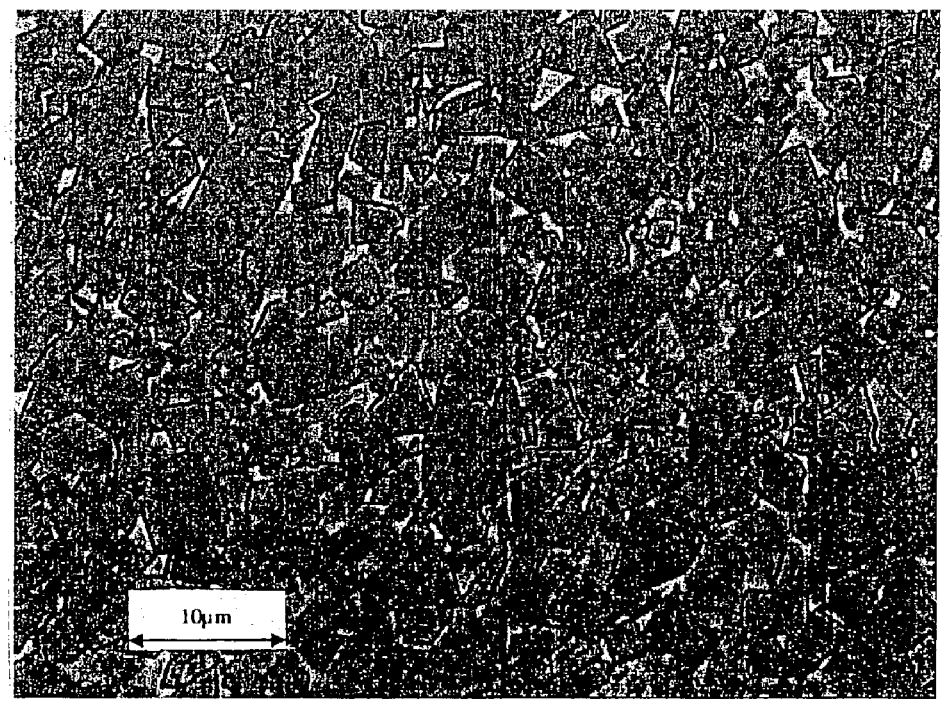
FIG. 17 is a photomicrograph of the bulk region of inventive sample ASW 454 having a 10 micrometer scale.
Figure 18:
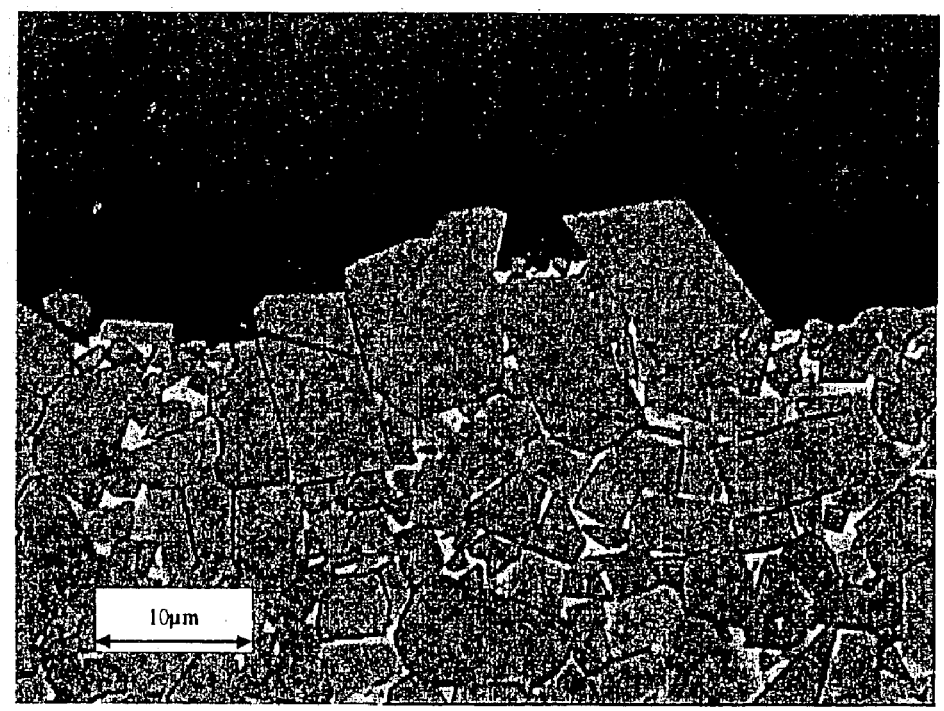
FIG. 18 is a photomicrograph of the surface region of inventive sample ASW 454 having a 10 micrometer scale.

Two additional examples (ASW 454 and ASW 455) were made in the same way and were of the same composition as Sample ASV556 hereinabove. These examples were re-sintered according to the following parameters: a temperature equal to about 2800 degrees Fahrenheit (about 1538 degrees Centigrade) at a pressure of about 1.5 torr nitrogen for a time of about 4 hours. The re-sintered substrates had a surface region and a bulk region. For the surface region of the first one of the examples, the average grain size of the tungsten carbide was 21.1 micrometers. For the bulk region of the first one of the examples, the average grain size of the tungsten carbide was 11.1 micrometers. FIG. 17 shows the microstructure of the bulk region of the first one of the examples (ASW 454). FIG. 18 shows the microstructure of the surface region of the first one of the examples (ASW 454).

Figure 19:
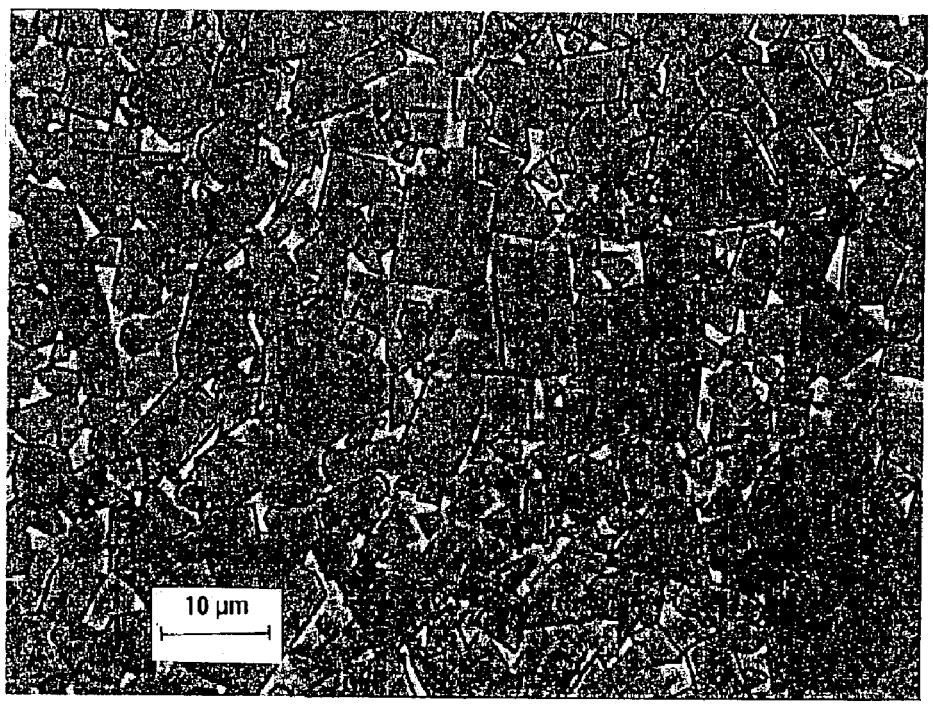
FIG. 19 is a photomicrograph of the bulk region of inventive sample ASW 455 having a 10 micrometer scale.
Figure 20:
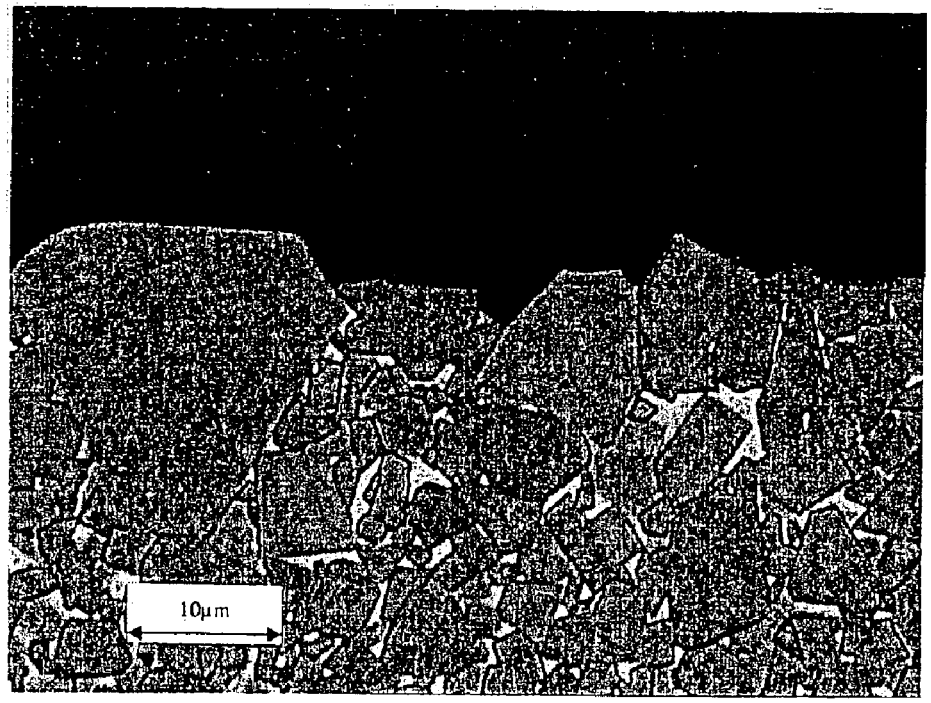
FIG. 20 is a photomicrograph of the surface region of inventive sample ASW 455 having a 10 micrometer scale.

Referring to the second one of the examples (ASW 455), the average tungsten carbide grain size of the surface region was 22.2 micrometers and the average tungsten carbide grain size of the bulk region was 11.7 micrometers. FIG. 19 shows the microstructure of the bulk region of the second one of examples (ASW 455). FIG. 20 shows the microstructure of the surface region of the second one of the examples (ASW 455).

As another example, there was provided a sintered substrate (Sample ASV 555) that had a composition of: 0.01–0.02 weight percent tantalum; less than 0.01 weight percent of the following elements: titanium, niobium, nickel, vanadium, chromium, molybdenum, and hafnium; 0.13–0.14 weight percent iron; 5.94–5.989 weight percent cobalt; and the balance being tungsten and carbon with most of the tungsten and carbon being in the form of tungsten carbide.

For the sintered substrate, the magnetic saturation value was 17.96 microtesla cubic meter per kilogram cobalt.

The hardness of the bulk region of the sintered substrate was 89.5 Rockwell A. The average tungsten carbide grain size in the bulk region was between about 3 micrometers and about 13 micrometers. The porosity of the sintered substrate determined according to ASTM Designation B276–91 (Reapproved 1996) was A02+B00–1+C00. There was no eta phase present in the sintered substrate.

Figure 16:
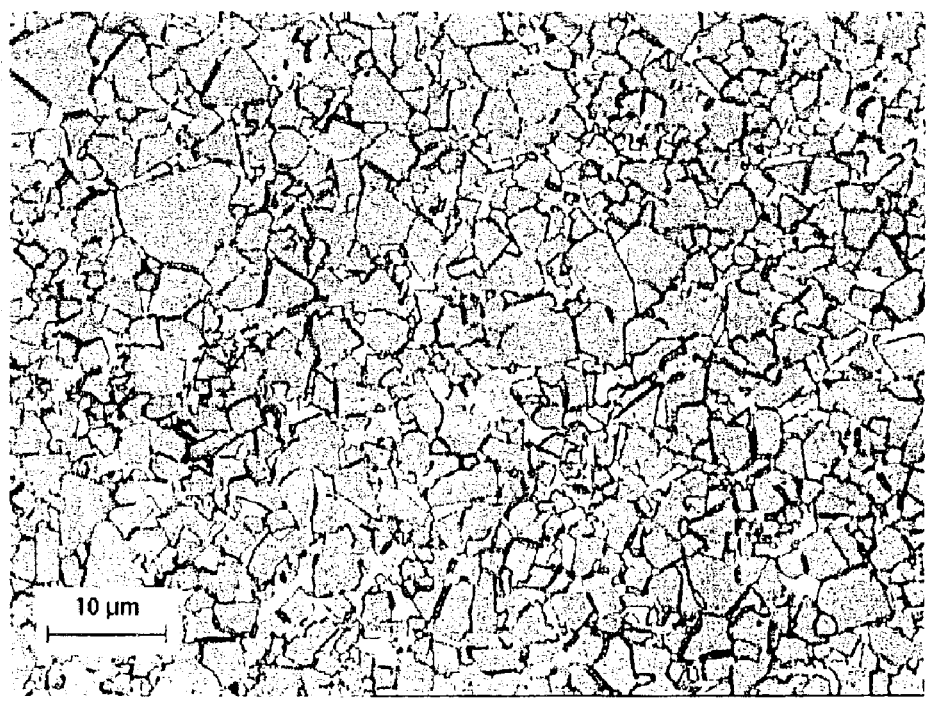
FIG. 16 is a photomicrograph (having a 10 micrometer scale) of the typical microstructure of the sintered substrate of the inventive sample ASV 555 after a two minute etch.

FIG. 16 is a photomicrograph that shows the typical microstructure of the bulk region of the sintered substrate of this sample after a two minute etching treatment. Referring to FIG. 16, the microstructure present therein has a generally uniform appearance.

The substrate was co-sintered along with other material at a temperature of about 2700 degrees Fahrenheit (about 1482 degrees Centigrade) for a duration of 45 minutes. The material with which the substrate was co-sintered did not contain a substantial amount of grain growth inhibitors (e.g., vanadium, chromium, tantalum, titanium, niobium).

Figure 21:
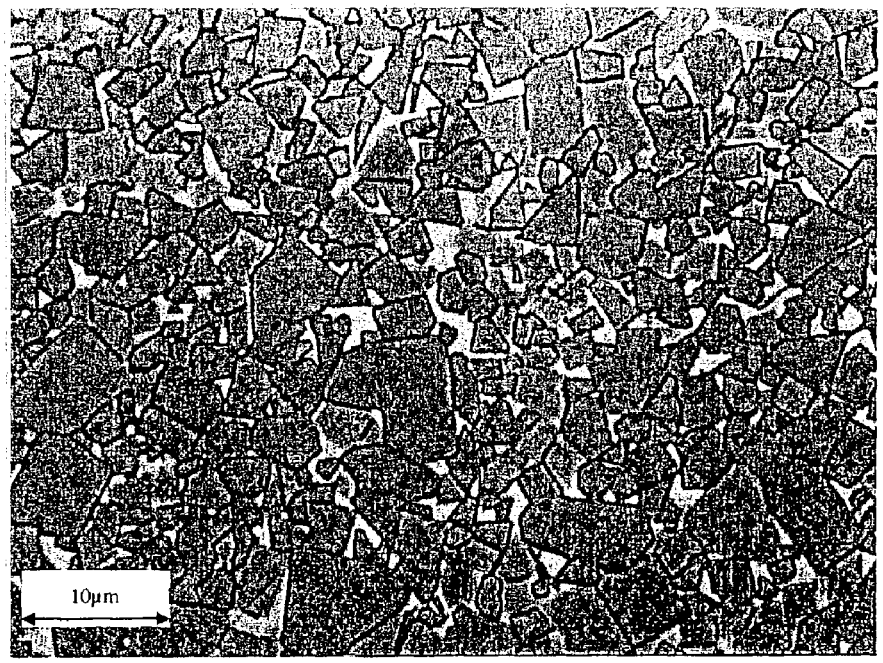
FIG. 21 is a photomicrograph of the bulk region of the inventive sample ASW 456 having a 10 micrometer scale.
Figure 22:
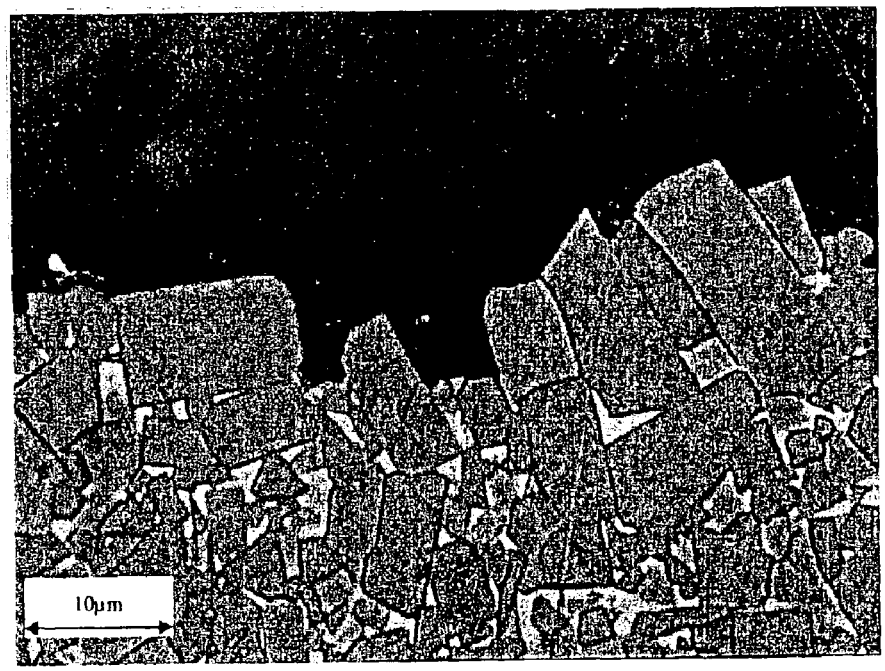
FIG. 22 is a photomicrograph of the surface region of the inventive sample ASW 456 having a 10 micrometer scale.

Two additional examples (ASW 456 and ASW 457) were made in the same way and were of the same composition as Sample ASV555 hereinabove. These examples were re-sintered according to the following parameters: a temperature equal to about 2800 degrees Fahrenheit (about 1538 degrees Centigrade) at a pressure of about 1.5 torr nitrogen for a time of about 4 hours. The re-sintered substrates had a surface region and a bulk region. Referring to the first one of the examples (ASW 456), the surface region had an average grain size of 21.8 micrometers and the bulk region had an average grain size of 12.0 micrometers. The depth of the surface region was about 21.8 micrometers. FIG. 21 shows the microstructure of the bulk region of the first one of the examples (ASW 456). FIG. 22 shows the microstructure of the surface region of the first one of the examples (ASW 456).

Figure 23:
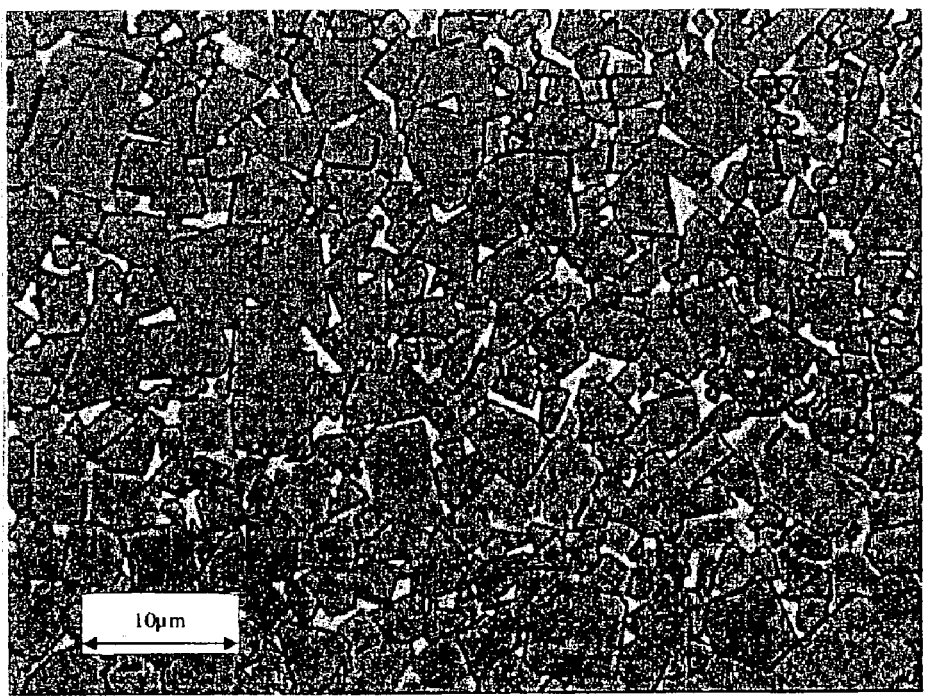
FIG. 23 is a photomicrograph of the bulk region of the inventive sample ASW 457 having a 10 micrometer scale.
Figure 24:
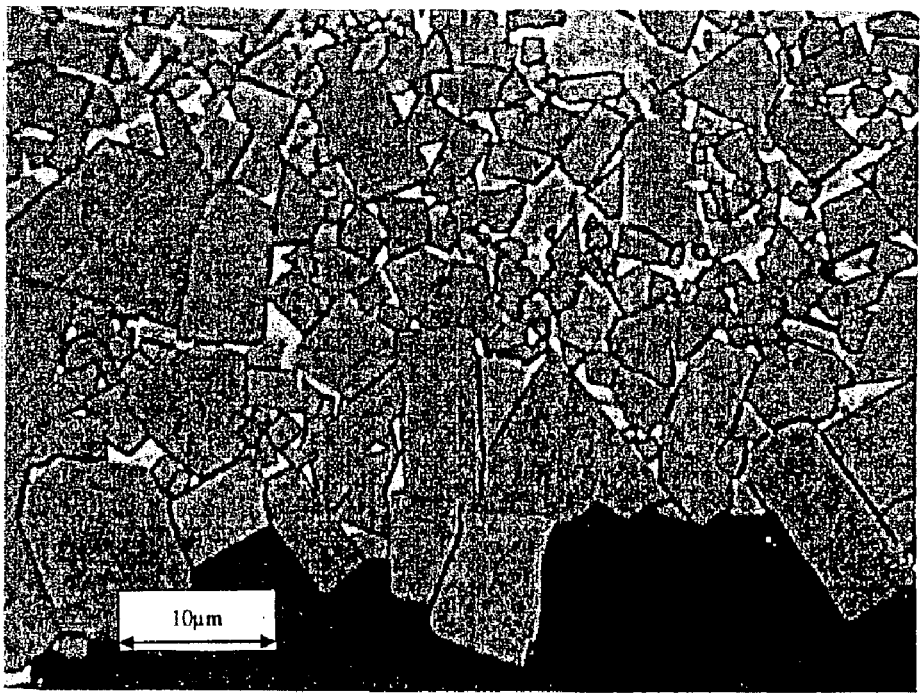
FIG. 24 is a photomicrograph of the surface region of the inventive sample ASW 457 having a 10 micrometer scale.

Referring to the second one of the examples, the surface region had an average grain size of 28.7 micrometers and the bulk region had an average grain size of 10.3 micrometers. FIG. 23 shows the microstructure of the bulk region of the second one of the examples (ASW 457). FIG. 24 shows the microstructure of the surface region of the second one of the examples (ASW 457).

As another example there was provided a sintered substrate (Sample ASV 557) that had a composition of: 0.02 weight percent tantalum; 0.13–0.14 weight percent iron; less than 0.01 weight percent of the following elements: titanium, niobium, nickel, vanadium, chromium, molybdenum, and hafnium; 6.06–6.085 weight percent cobalt; and the balance tungsten and carbon wherein most of the tungsten and carbon is in the form of tungsten carbide.

Figure 25:
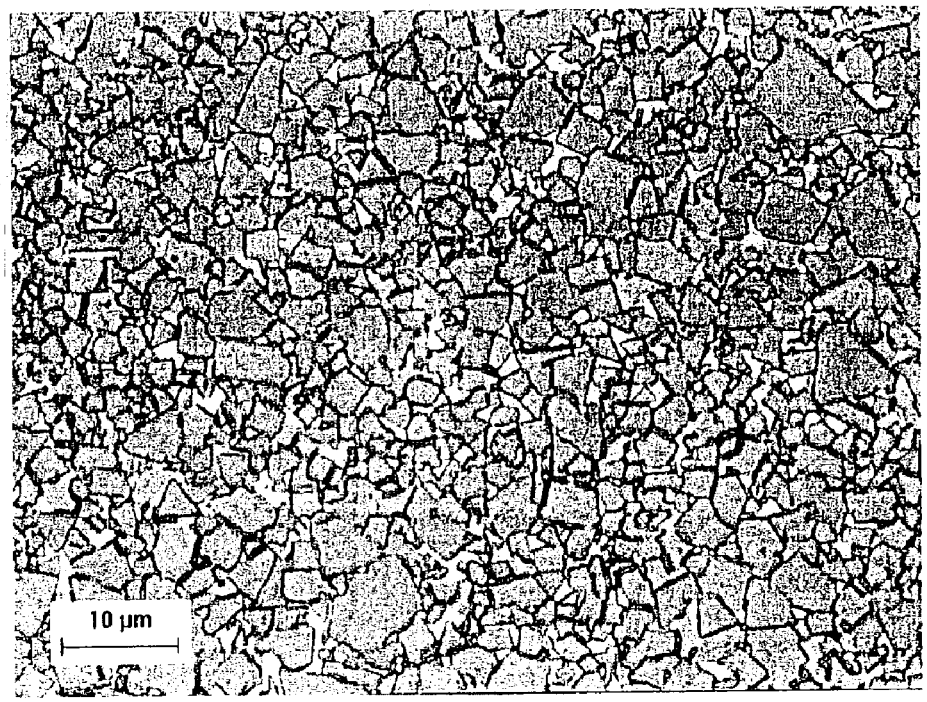
FIG. 25 is a photomicrograph (having a 10 micrometers scale) that shows the typical microstructure of the sintered substrate of the inventive sample ASV 557 after a two minute etch.

The substrate was sintered by itself at a temperature of about 2625 degrees Fahrenheit (about 1441 degrees Centigrade) for a duration of 45 minutes. For the sintered substrate, the magnetic saturation value was between 18.2 and 20.2 microtesla cubic meter per kilogram cobalt. FIG. 25 shows the typical microstructure of the sintered substrate.

The hardness of the sintered substrate was 89.6 Rockwell A. The average grain size of the tungsten carbide in the bulk region was between about 3 micrometers and about 13 micrometers included with a few larger grains of tungsten carbide to a size of 19 micrometers and a patch of fine-grained cemented (cobalt) tungsten carbide. The porosity of the sintered substrate determined according to ASTM Designation B276–91 (Reapproved 1996) was A02+B00+C00 at the edges and A02+B00+C00. There was no eta phase present in the sintered substrate.

Figure 26:
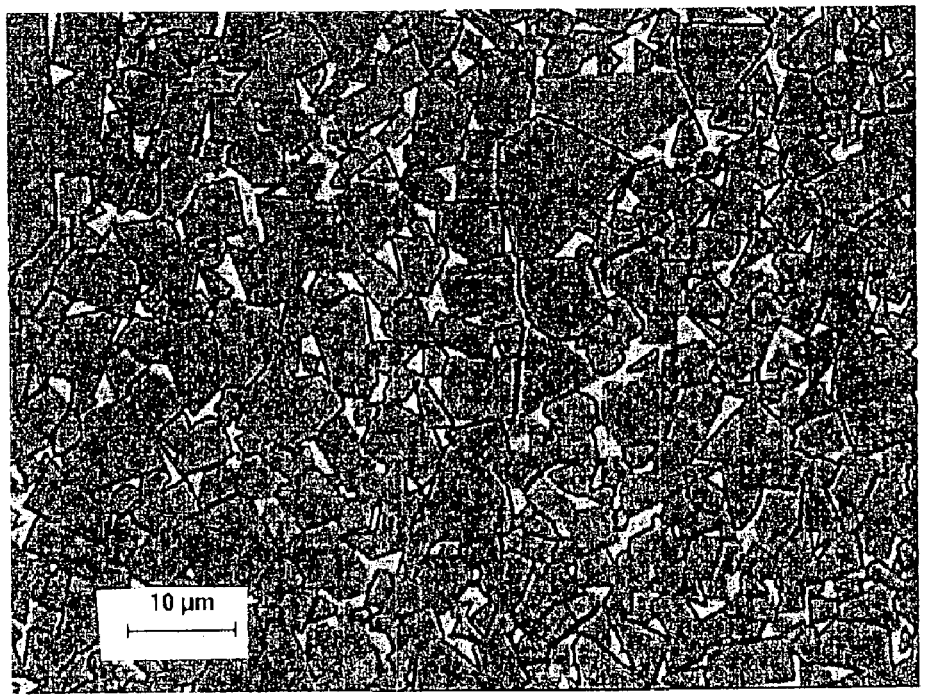
FIG. 26 is a photomicrograph of the bulk region of the inventive sample ASW 458 having a 10 micrometer scale.
Figure 27:
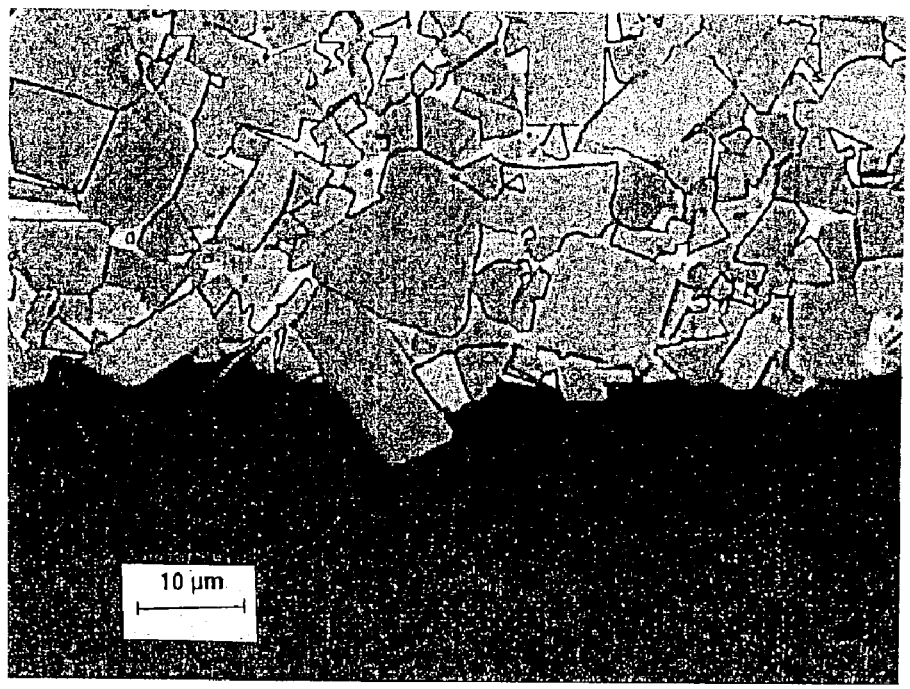
FIG. 27 is a photomicrograph of the surface region of the inventive sample ASW 458 having a 10 micrometer scale.

Two (ASW 458 and ASW 459) additional examples were made in the same way and were of the same composition as Sample ASV557 hereinabove. These samples were re-sintered according to the following parameters: a temperature equal to about 2800 degrees Fahrenheit (about 1538 degrees Centigrade) at a pressure of about 1.5 torr nitrogen for a time of about 4 hours. The re-sintered substrates had a surface region and a bulk region. Referring to the first example (ASW 458), the surface region had an average grain size of 14.3 micrometers. The bulk region had an average grain size of 8.1 micrometers. FIG. 26 shows the microstructure of the bulk region of the first one of the examples (ASW 458). FIG. 27 shows the microstructure of the surface region of the first one of the examples (ASW 458).

Figure 28:
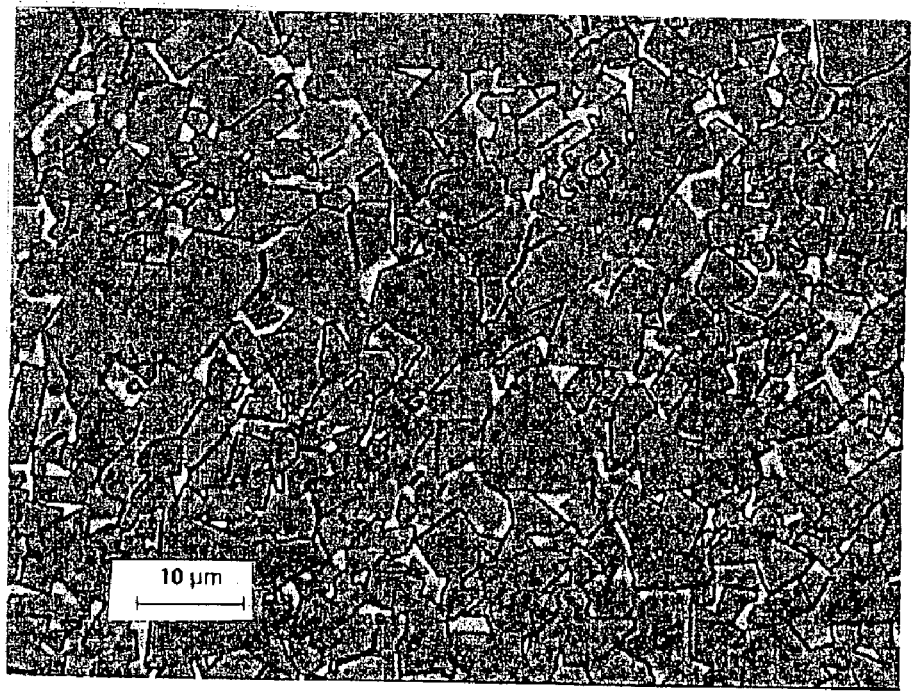
FIG. 28 is a photomicrograph of the bulk region of the inventive sample ASW 459 having a 10 micrometer scale.
Figure 29:
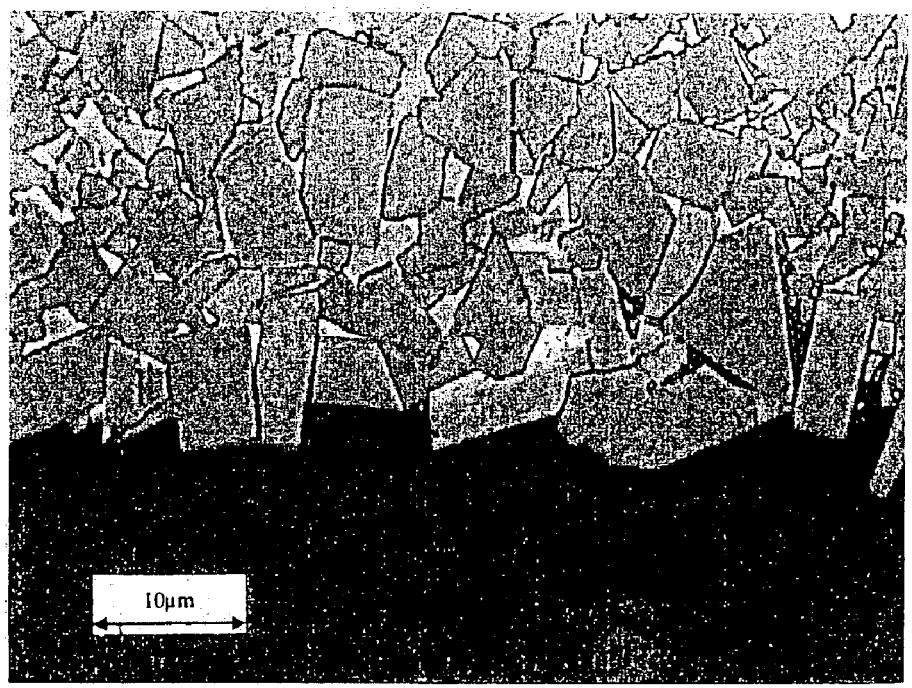
FIG. 29 is a photomicrograph of the surface region of the inventive sample ASW 459 having a 10 micrometer scale.

Referring to the second example, the surface region had an average grain size of 28.4 micrometers and the bulk region had an average grain size of 8.9 micrometers. FIG. 28 shows the microstructure of the bulk region of the second one of the examples (ASW 459). FIG. 29 shows the microstructure of the surface region of the second one of the examples (ASW 459).

As another example there was provided a sintered substrate (ASW073) that had a composition of: 0.01 weight percent tantalum; 0.13–0.14 weight percent iron; less than 0.01 weight percent of the following elements: titanium, niobium, nickel, vanadium, chromium, molybdenum and hafnium; 6.05–6.06 weight percent cobalt; and the balance tungsten and carbon with most of the tungsten and carbon being in the form of tungsten carbide.

Figure 30:
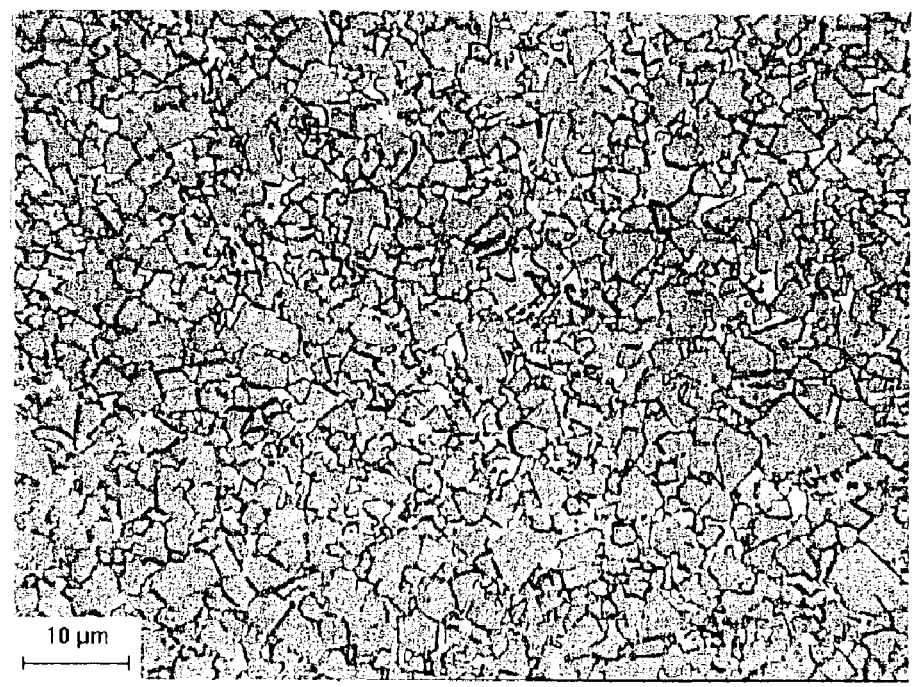
FIG. 30 is a photomicrograph (having a 10 micrometer scale) of the typical microstructure of the sintered substrate of the inventive sample ASWO73 after a two minute etch.

FIG. 30 shows the typical microstructure of the bulk region of this sample after a two minute etching treatment.

The hardness of the sintered substrate was 89.2 Rockwell A. The average grain size of the tungsten carbide grains in the bulk region was between about 3 micrometers and about 13 micrometers. The porosity of the re-sintered substrate determined according to ASTM Designation B276–91 (Reapproved 1996) was A04+B04+C00.

Two (ASW 460 and ASW 461) additional examples were made in the same way and were of the same composition as Sample ASW073. These examples were re-sintered according to the following parameters: a temperature equal to about 2800 degrees Fahrenheit (about 1538 degrees Centigrade) at a pressure of about 1.5 torr nitrogen for a time of about 4 hours. The re-sintered substrates had a surface region and a bulk region.

Figure 31:
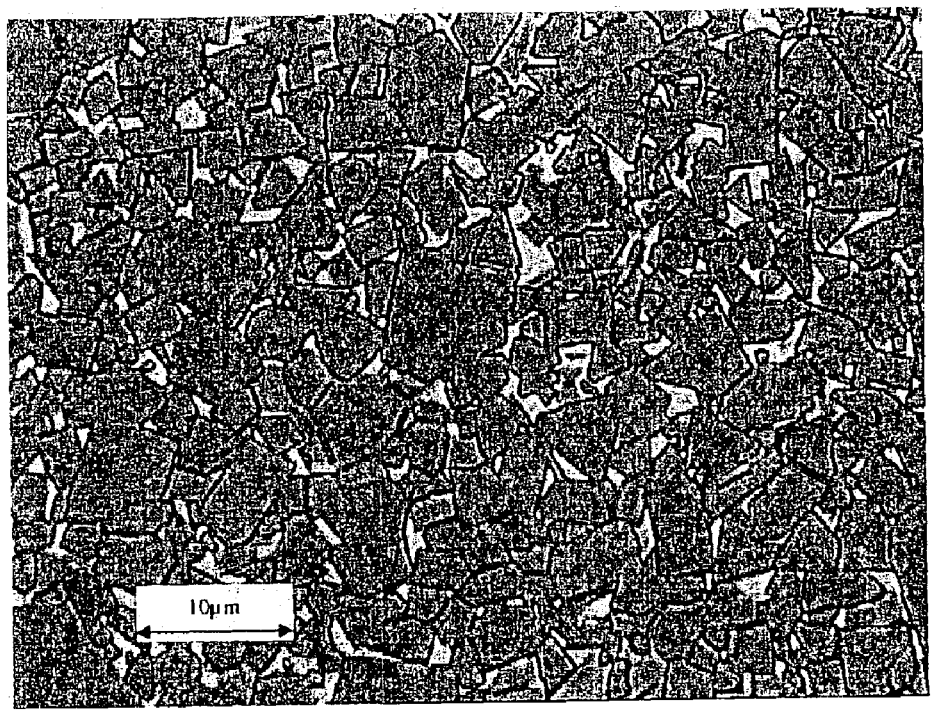
FIG. 31 is a photomicrograph of the bulk region of the inventive sample ASW 460 having a 10 micrometer scale.
Figure 32:
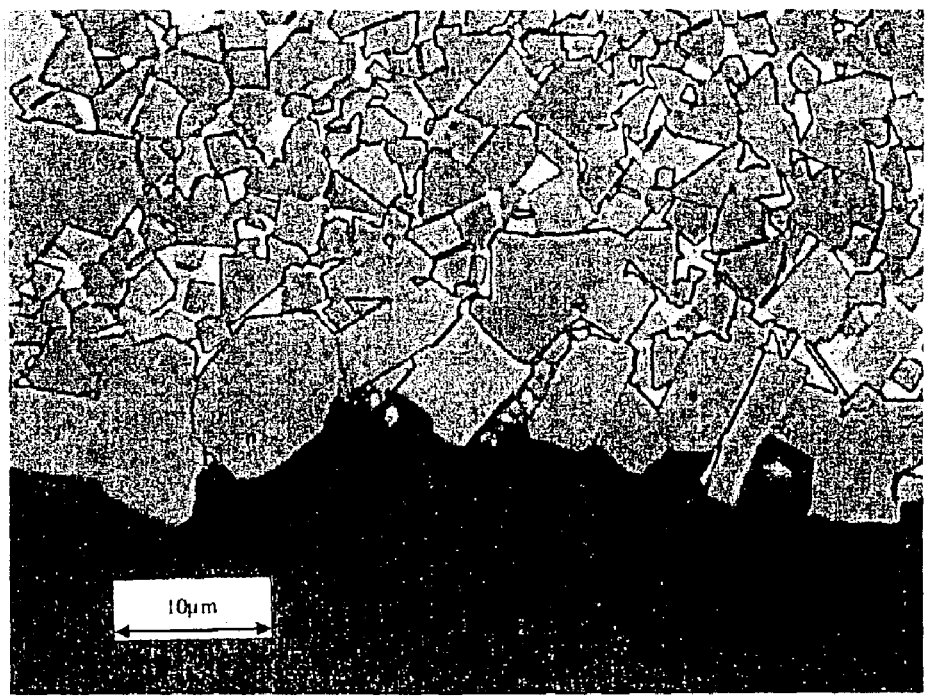
FIG. 32 is a photomicrograph of the surface region of the inventive sample ASW 460 having a 10 micrometer scale.

Referring to the first one of the examples (ASW 460), the surface region had an average grain size for the tungsten carbide of 55.1 micrometers and the bulk region had an average grain size of 9.0 micrometers. FIG. 31 shows the microstructure of the bulk region of the first example (ASW 460). FIG. 32 shows the microstructure of the surface region of the first example (ASW 460).

Figure 33:
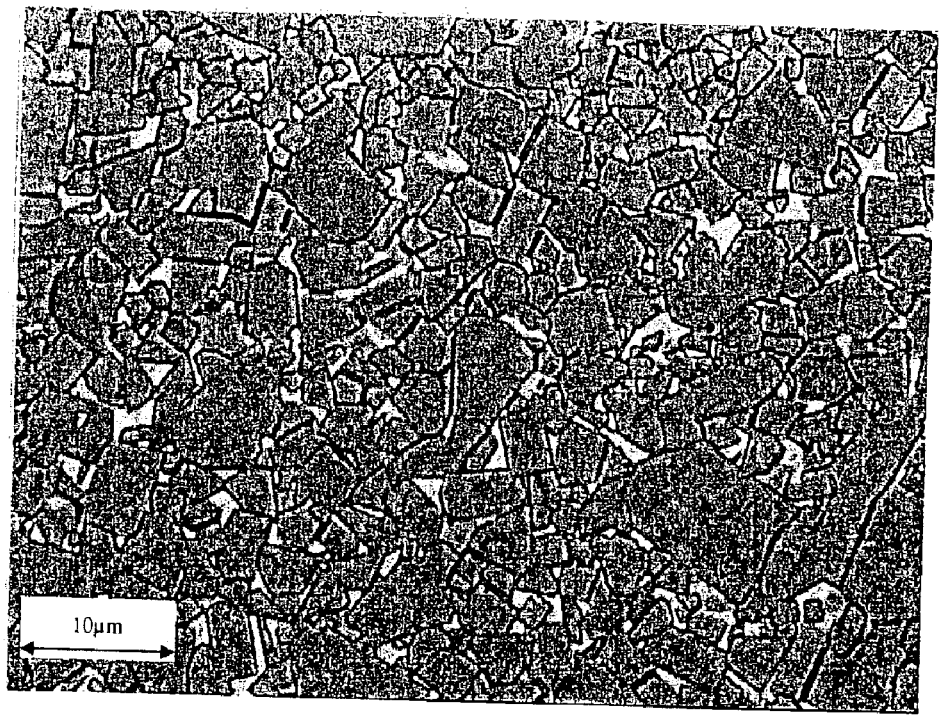
FIG. 33 is a photomicrograph of the bulk region of the inventive sample ASW 461 having a 10 micrometer scale.
Figure 34:
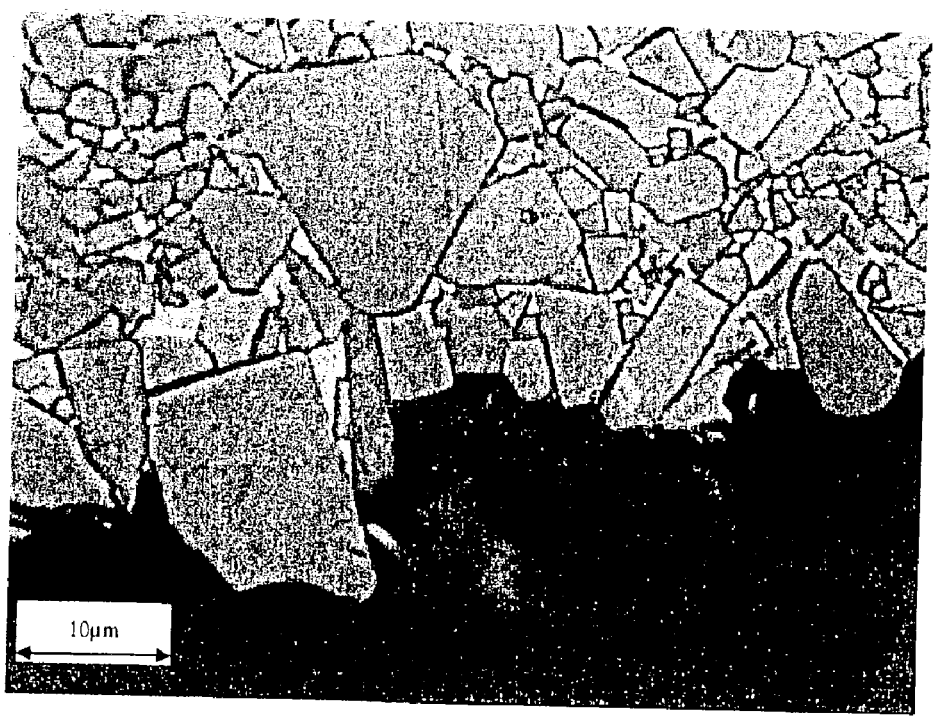
FIG. 34 is a photomicrograph of the surface region of the inventive sample ASW 461 having a 10 micrometer scale.

Referring to the second one of the examples, the surface region had an average grain size for the tungsten carbide of 29.7 micrometers and the bulk region had an average grain size for the tungsten carbide of 10.2 micrometers. FIG. 33 shows the microstructure of the bulk region of the second example (ASW 461). FIG. 34 shows the microstructure of the surface region of the second example (ASW 461).

The patents and other documents identified herein are hereby incorporated by reference herein.

Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A diamond coated cutting tool produced by a process comprising the steps of:

providing a sintered substrate, the sintered substrate comprising tungsten carbide and cobalt, the sintered substrate having an average tungsten carbide grain size of between about 3 micrometers and about 20 micrometers;

re-sintering the sintered substrate to produce a re-sintered substrate, the re-sintered substrate having a surface and the re-sintered substrate having a surface region beginning at and extending inwardly from the surface, the re-sintered substrate having a bulk region inwardly of the surface region, and the surface region of the re-sintered substrate having an average tungsten carbide grain size of between about 12 micrometers and about 60 micrometers, the bulk region of the re-sintered substrate having an avenge tungsten carbide grain size of between about 3 micrometers and about 20 micrometers, and wherein the average tungsten carbide grain size in the surface region is greater than the average tungsten carbide grain size in the bulk region;

subjecting the re-sintered substrate to a chemical treatment for the removal of cobalt at the surface of the re-sintered substrate to produce a treated substrate; and adherently depositing a diamond coating to at least a portion of the surface of the treated substrate.

2. The cutting tool according to claim 1, wherein the magnetic saturation value of the sintered substrate being between about 17.3 and about 19.8 microtesla cubic meter per kilogram cobalt.

3. The cutting tool according to claim 1, wherein the magnetic saturation value of the sintered substrate being between about 17.8 and about 18.8 microtesla cubic meter per kilogram cobalt.

4. The cutting tool according to claim 1, wherein the sintered substrate having an average tungsten carbide grain size of between about 15 micrometers and about 20 micrometers.

5. The cutting tool according to claim 1, wherein the re-sintered substrate having a first level of residual surface cobalt and the treated substrate having a second level of residual surface cobalt, and the second level of residual surface cobalt being less than the first level of residual surface cobalt.

6. The cutting tool according to claim 1, wherein the re-sintered substrate having a first level of residual surface cobalt and the treated substrate having a second level of residual surface cobalt, and the second level of residual surface cobalt being as low as one-tent of the first level of residual surface cobalt.

7. The cutting tool according to claim 1, wherein the average tungsten carbide grain size in the surface region is between about 170 percent and about 320 percent greater than the average tungsten carbide grain size in the bulk region.

8. The cutting tool according to claim 1, wherein the average tungsten carbide grain size in the surface region is between about 170 percent and about 200 percent greater than the average tungsten carbide grain size in the bulk region.

9. The cutting tool according to claim 1, wherein the average tungsten carbide grain size in the surface region is between about 180 percent and about 190 percent greater than the average tungsten carbide grain size in the bulk region.

10. A diamond coated cutting tool comprising:
a re-sintered substrate, the re-sintered substrate having a composition comprising between about 2 weight percent to about 12 weight percent cobalt, and tungsten and carbon wherein most of the tungsten and carbon is in the form of tungsten carbide;
the re-sintered substrate having a surface, and the surface being subjected to a chemical treatment;
the re-sintered substrate having a surface region extending inwardly from the surface and a bulk region being inwardly of the surface region;
the surface region having an average tungsten carbide grain size of between about 12 micrometers and about 60 micrometers;
the bulk region having an average tungsten carbide grain size of between about 3 micrometers and about 20 micrometers, and wherein the average tungsten carbide grain size in the surface region is greater than the average tungsten carbide grain size in the bulk region; and
a diamond coating on the surface of the re-sintered substrate.

11. The diamond coated cutting tool according to claim 10 wherein the average tungsten carbide grain size in the surface region is between about 170 percent end about 320 percent greater than the average tungsten carbide grain size in the bulk region.

12. The diamond coated cutting tool according to claim 10 wherein the average tungsten carbide grain size in the surface region is between about 170 percent and about 200 percent greater than the average tungsten carbide grain size in the bulk region.

13. The diamond coated cutting tool according to claim 10 wherein the a average tungsten carbide grain the surface region is between about 170 percent to about 190 percent greater than the average tungsten carbide grain size in the bulk region.

14. The diamond coated cutting tool according to claim 10 wherein the re-suitered substrate contains less than about 0.4 weight percent of carbide-forming elements other than tungsten.

15. The diamond coated cutting tool according to claim 10 wherein the re-sinteted substrate contains less than about 0.1 weight percent of carbide-forming elements other than tungsten.

16. A diamond coated cutting tool comprising:
a re-sintered substrate, the re-sintered substrate having a composition comprising between about 2 weight percent to about 12 weight percent cobalt and tungsten and carbon wherein most of the tungsten and carbon is in the form of tungsten carbide;
the re-sintered substrate having a surface, and the surface being subjected to a chemical treatment;
the re-sintered substrate having a surface region extending inwardly from the surface and a bulk region being inwardly of the surface region;
the bulk region having an average tungsten carbide grain size of between about 3 micrometers and about 20, and wherein the average tungsten carbide grain size in the surface region is greater than the average tungsten carbide grain size in the bulk region; and
a diamond coating on the surface of the re-sintered substrate.

17. The diamond coated cutting tool according to claim 16 wherein the average tungsten carbide grain size in the surface region is between about 170 percent and about 320 percent greater than the average tungsten carbide grain size in the bulk region.

18. The diamond coated cutting tool according to claim 16 wherein the average tungsten carbide grain size in the surface region is about 170 percent and about 200 percent greater than the avenge tungsten carbide grain size in the bulk region.

19. The diamond coated cutting tool according to claim 16 wherein the average tungsten carbide grain size in the surface region is about between 180 percent and about 190 percent greater than the average tungsten Carbide grain size in the bulk region.

20. The diamond coated cutting tool according to claim 16 wherein the surface region having an average tungsten carbide grain size of between about 12 micrometers and about 30 micrometers.

21. The diamond coated cutting tool according to claim 16 wherein the surface region having an average tungsten carbide grain size of between about 20 micrometers and about 30 micrometers.

22. The diamond coated cutting tool according to claim 16 wherein the re-sintered substrate contains less than about 0.1 weight percent of carbide-forming elements other than tungsten.

23. The diamond coated cutting tool according to claim 16 wherein the re-sintered substrate contains less than about 0.1 weight percent of carbide-forming elements other than tungsten.

* * * * *